United States Patent
Yagishita et al.

(10) Patent No.: US 7,537,978 B2
(45) Date of Patent: May 26, 2009

(54) SEMICONDUCTOR DEVICE AND MANUFACTURING METHOD THEREOF

(75) Inventors: Atsushi Yagishita, Yokohama (JP); Ichiro Mizushima, Yokohama (JP); Tsutomu Sato, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 129 days.

(21) Appl. No.: 11/717,068

(22) Filed: Mar. 13, 2007

(65) Prior Publication Data

US 2007/0176237 A1    Aug. 2, 2007

Related U.S. Application Data

(62) Division of application No. 11/137,539, filed on May 26, 2005, now Pat. No. 7,208,353, which is a division of application No. 10/436,181, filed on May 13, 2003, now Pat. No. 6,979,846.

(30) Foreign Application Priority Data

May 13, 2002    (JP)    ............... 2002-137268

(51) Int. Cl.
*H01L 21/00* (2006.01)
(52) U.S. Cl. ........................................ 438/149
(58) Field of Classification Search ................ 438/149, 438/197, 199, 301, 152; 257/347, 288, 204, 257/E21.409

See application file for complete search history.

(56) References Cited

U.S. PATENT DOCUMENTS 6,072,217 A    6/2000    Burr 6,281,053 B1 *  8/2001  Yuda .................... 438/149
6,420,767 B1    7/2002  Krishnan et al.
6,433,609 B1    8/2002  Voldman
6,465,823 B1    10/2002 Yagishita et al.

(Continued)

FOREIGN PATENT DOCUMENTS

JP    H07-131025    5/1995

(Continued)

OTHER PUBLICATIONS

Notification of the First Office Action in copending Chinese Patent Application No. 2005100842975 dated Jan. 4, 2008 and English language translation thereof.

(Continued)

*Primary Examiner*—Nathan W Ha
(74) *Attorney, Agent, or Firm*—Finnegan, Henderson, Farabow, Garrett & Dunner, L.L.P.

(57) ABSTRACT

A semiconductor device comprises a support layer made of semiconductor, a diffusion layer formed by implanting impurities in a surface layer of the support layer, a buried insulating layer provided on the diffusion layer, an island-like active layer provided on the buried insulating layer, a channel region formed in the active layer, source and drain regions formed in the active layer, sandwiching the channel region, a gate insulating film formed on the channel region, a gate electrode formed on the gate insulating film and on side surfaces of the island-like active layer, and insulated and isolated from the channel, source, and drain regions, and an electrode connected to the active layer.

15 Claims, 34 Drawing Sheets

U.S. PATENT DOCUMENTS

| | | | |
|---|---|---|---|
| 6,521,957 | B2 | 2/2003 | Patelmo et al. |
| 6,566,177 | B1 * | 5/2003 | Radens et al. ............... 438/152 |
| 6,576,928 | B2 * | 6/2003 | Hiratani et al. ............... 257/68 |
| 6,645,796 | B2 | 11/2003 | Christen et al. |
| 6,682,966 | B2 | 1/2004 | Iwata et al. |
| 6,787,850 | B1 | 9/2004 | Pelloie |

FOREIGN PATENT DOCUMENTS

| | | |
|---|---|---|
| JP | 9-162417 | 6/1997 |
| JP | 2000-12858 | 1/2000 |
| JP | 2000-260991 | 9/2000 |
| JP | 2001-44441 | 2/2001 |
| JP | 2001-077364 | 3/2001 |
| JP | 2001-144276 | 5/2001 |
| JP | 2002-110994 | 4/2002 |
| TW | 365017 | 7/1999 |

OTHER PUBLICATIONS

Suzuki, K. et al. "Analytical Surface Potential Expression for Thin-Film Double-Gate SOI MOSFETs," Solid State Electronics, vol. 37(2) pp. 327-332, 1994.

Assaderaghi, F. et al., "Dynamic Threshold-Voltage MOSFET (DTMOS) for Ultra-Low Voltage VLSI", *IEEE Transactions on Electron Devices*, vol. 44, No. 3, pp. 414-422 (1997).

T. Sato, et al., "A New Substrate Engineering for the Formation of Empty Space in Silicon (ESS), induced by Silicon Surface Migration," *IEDM Tech. Dig.*, pp. 517-520, (1999).

K. Suzuki, et al., "Analytical Surface Potential expression for Double-Gate SOI MOSFETs," *Int'l Workshop on VLSI Process and Development Modeling*, pp. 150-151, (1993).

M. Takamiya, et al., "High Performance Electrically Induced Body Dynamic Threshold SOI MOSFET (EIB-DTMOS) With Large Body Effect and Low Threshold Voltage," *IEDM Tech. Dig.*, pp. 423-426 (1998).

T. Tanaka, et al., "Ultrafast Lowe Power Operaiton of p+-n+Double-Gate SOI MOSFETs," *Digest Of Technical Papers-Symposium on VLSI Technology*, pp. 11-12, (1994).

Tang, Stephen Hsien Shun, "Dynamic Threshold MOSFETs for Future Integrated Circuits", A Dissertation Submitted in Partial Satisfaction of the Requirements for the Degree of Doctor of Philosophy in Engineering-Electrical Engineering and Computer Sciences in the Graduate Division of the University of California at Berkeley, pp. 1-129, (Spring 2001).

A. Yagishita, et al., Dynamic Threshold Voltage Damascene Metal Gate MOSFET (DT-DMG-MOS) with Low Threshold Voltage, High Drive Current, and Uniform Electrical Characteristics, *IEDM Tech. Dig.*, pp. 663-666, (2000).

Cork Institute of Technology, *Solid State Devices*, pp. 1-3, (1999).

Purdue University, "MOS Electrostatics," *EE-595N*, pp. 1-4 (2000).

Office Action from the State Intellectual Property Office of the People's Republic of China.

Notification of Reasons for Rejection in copending Japanese Patent Application No. 2002-137268 and English language translation thereof.

* cited by examiner

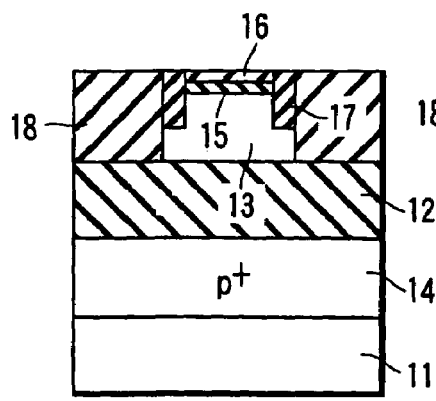
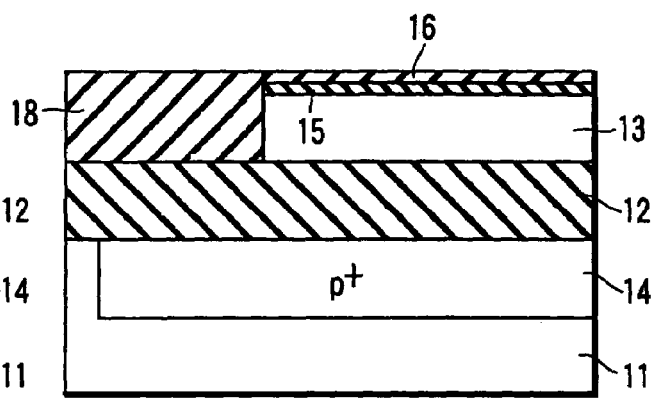
FIG. 7A  FIG. 7B
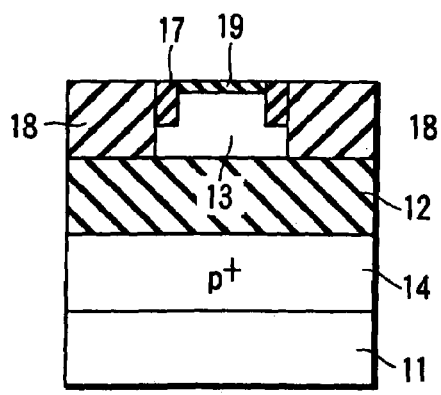
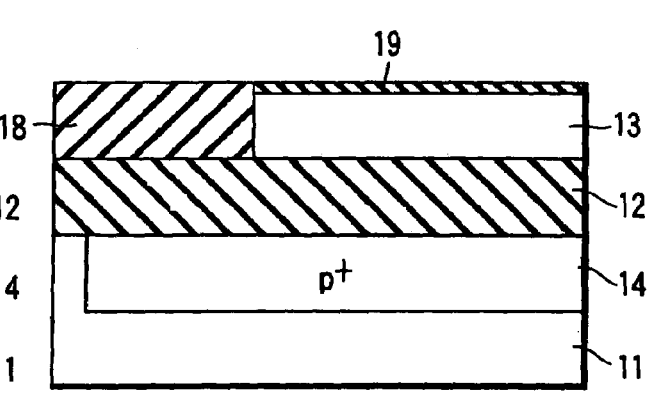
FIG. 8A  FIG. 8B
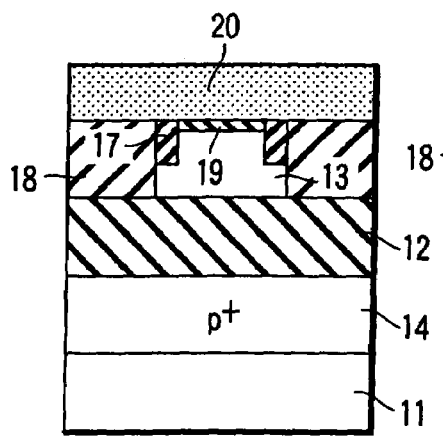
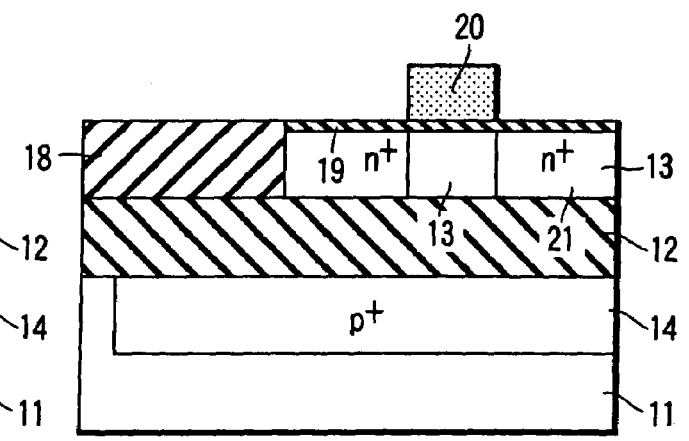
FIG. 9A  FIG. 9B

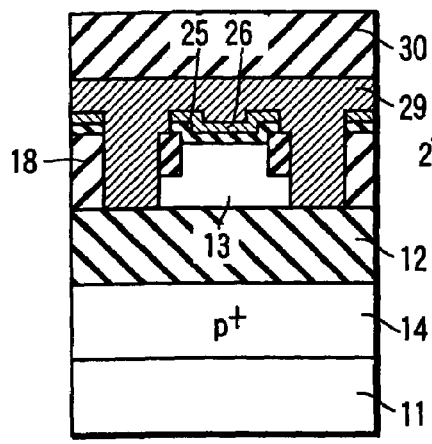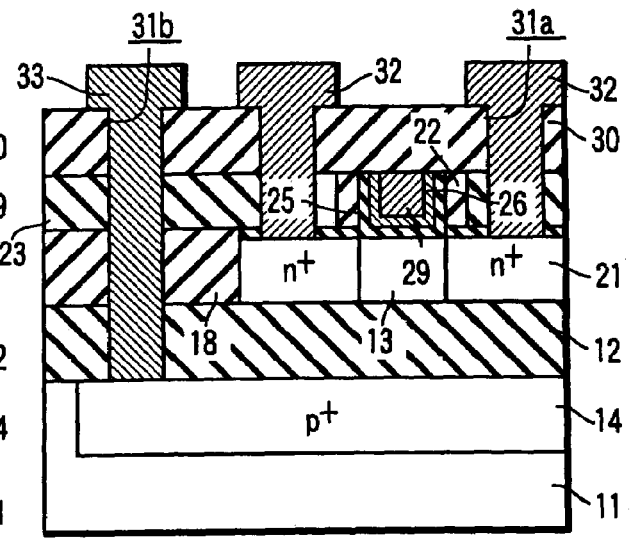
FIG. 16A    FIG. 16B
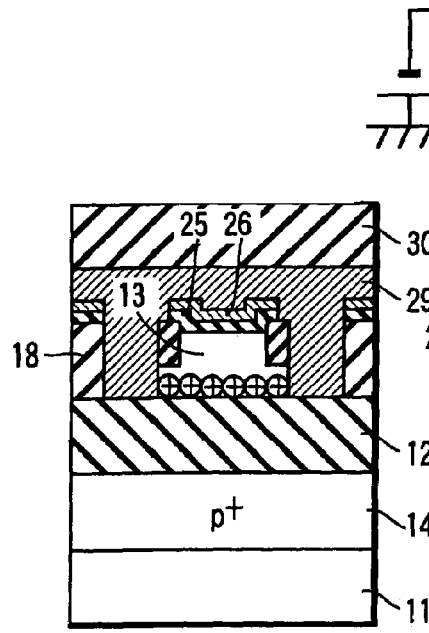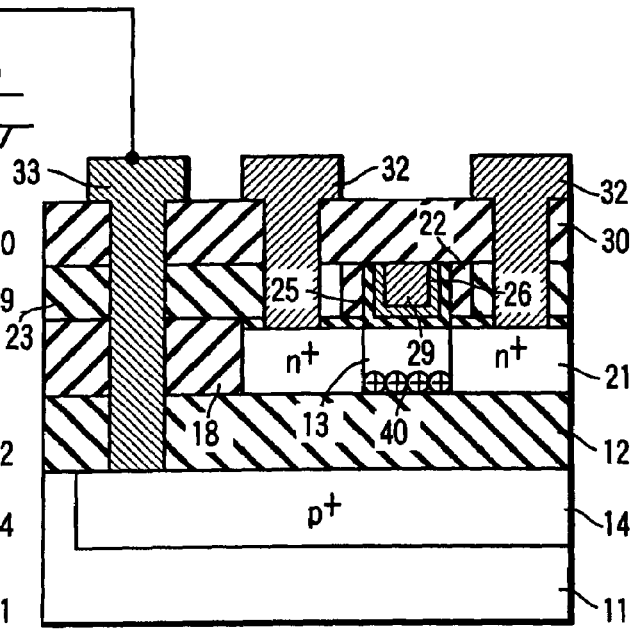
FIG. 17A    FIG. 17B

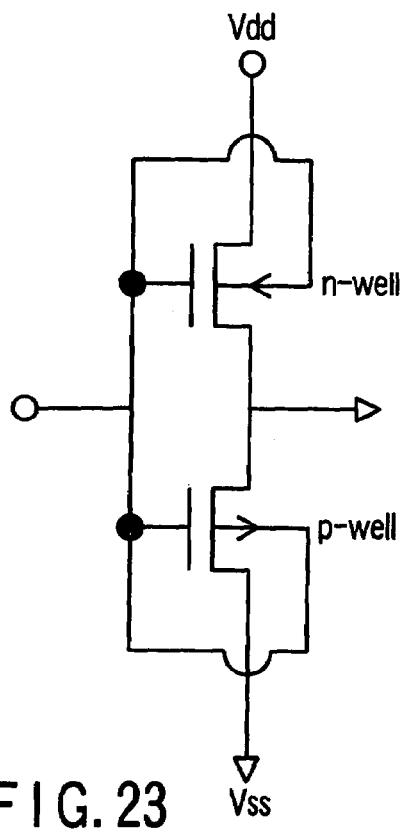
FIG. 23
| Truth-value table |||
|---|---|---|
| Input Vin1 | Input Vin2 | Output Vout |
| 0 | 0 | 1 |
| 0 | 1 | 1 |
| 1 | 0 | 1 |
| 1 | 1 | 0 |
FIG. 25
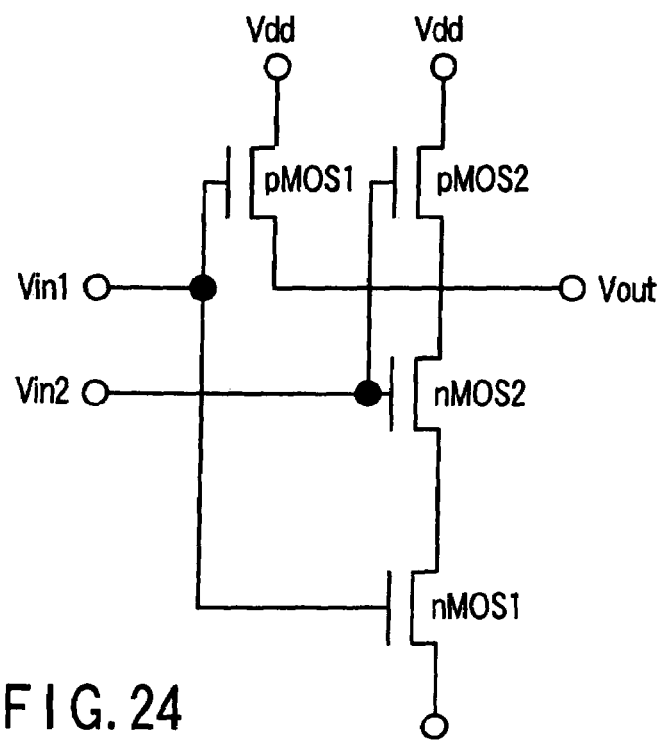
FIG. 24

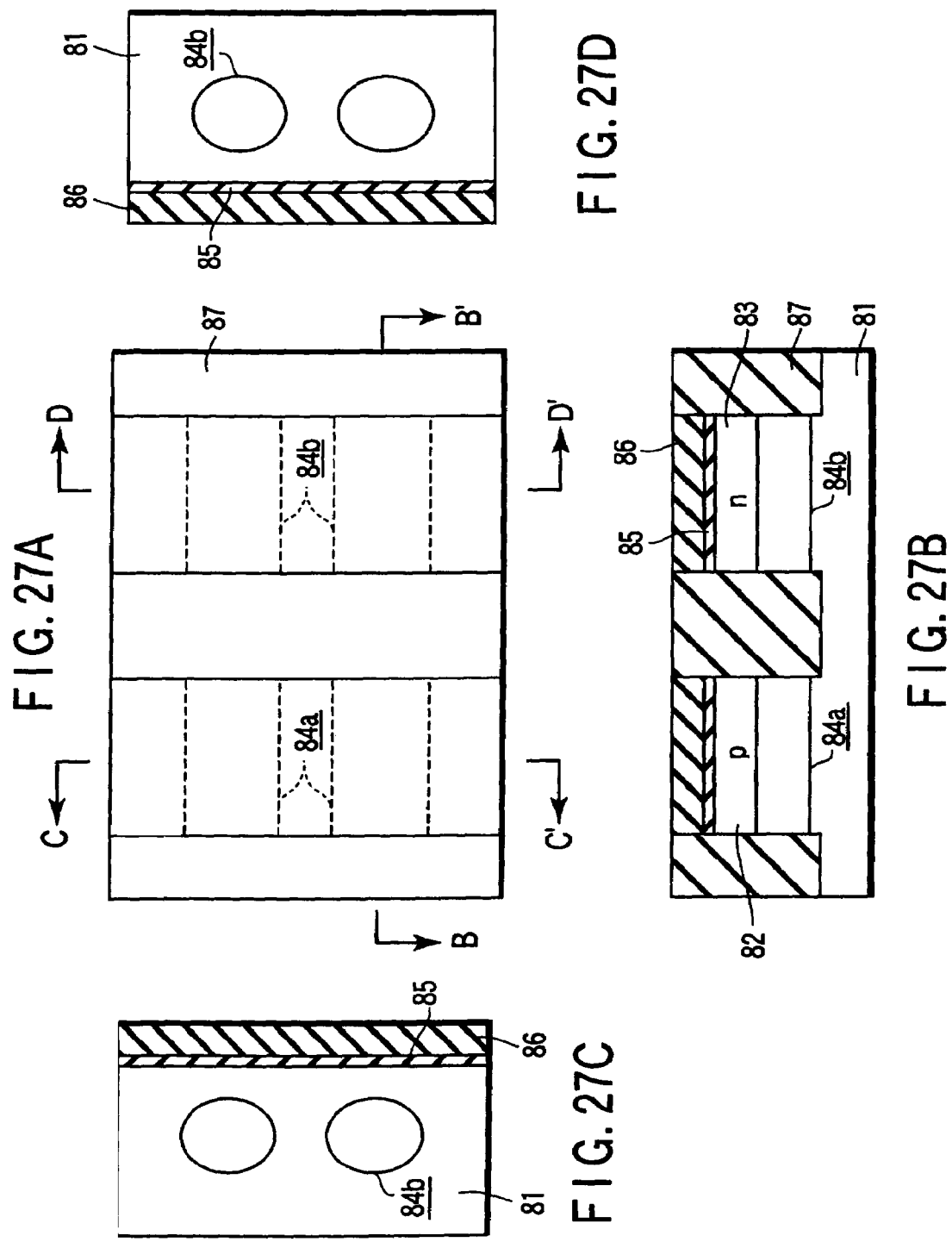

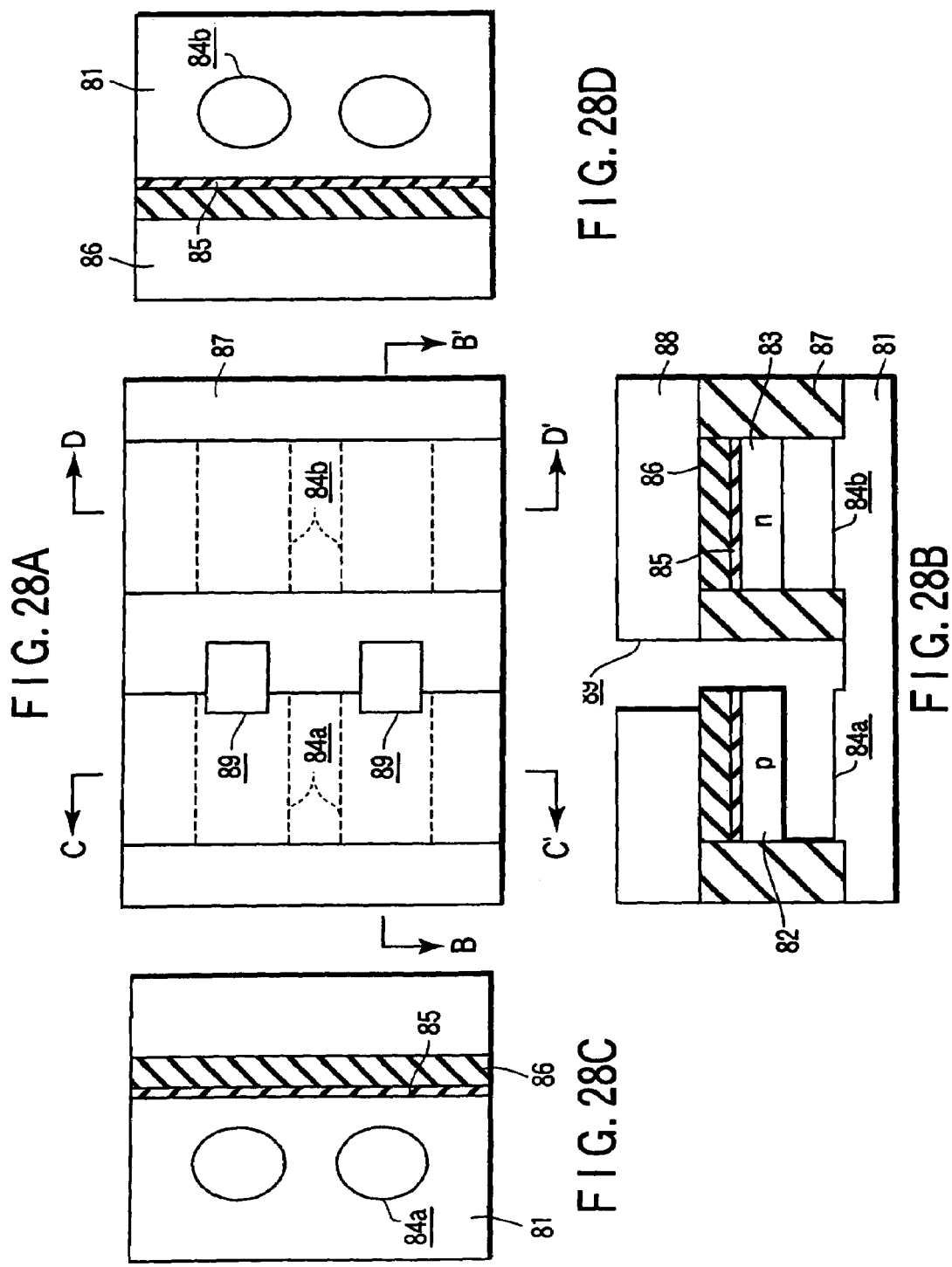

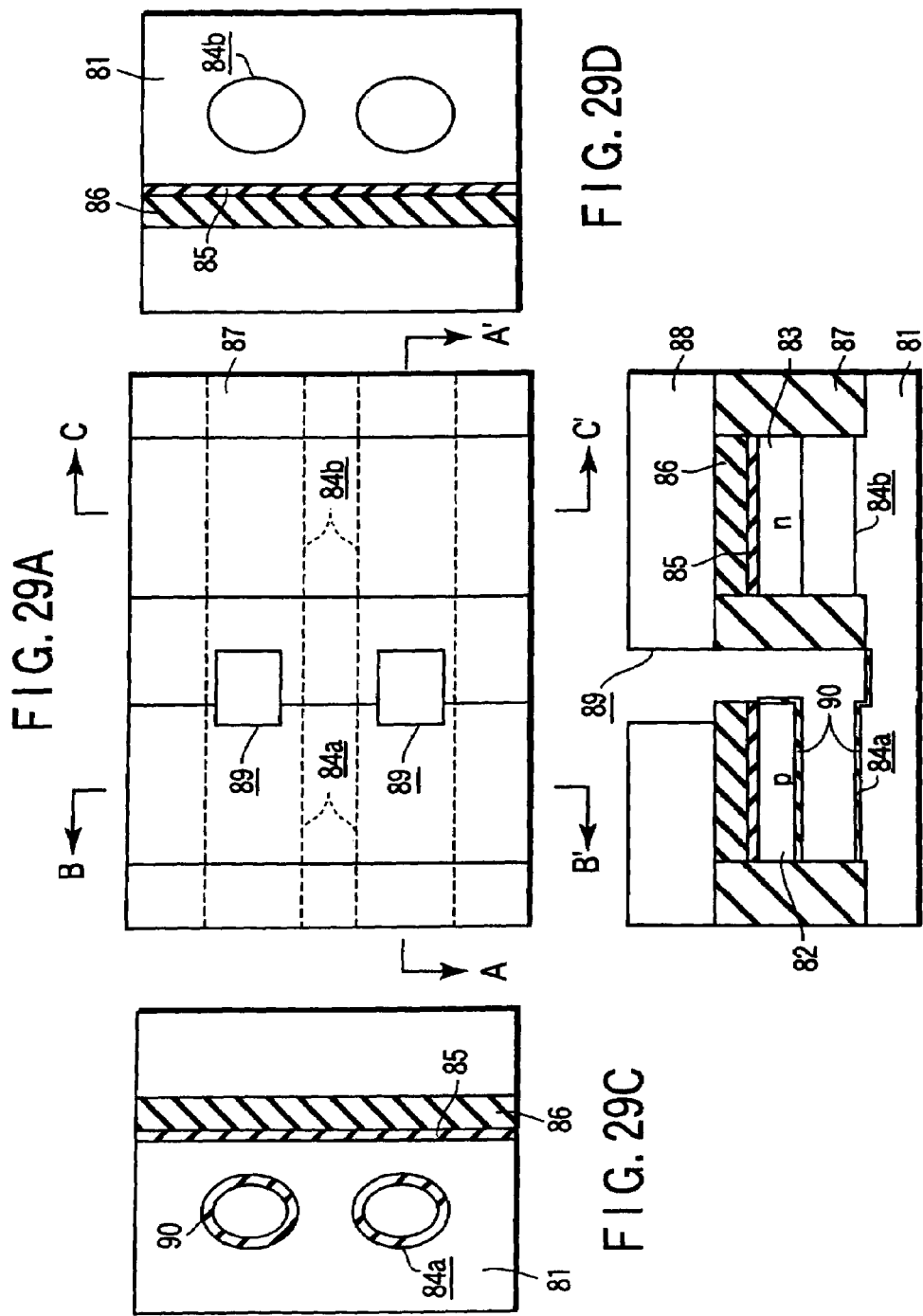

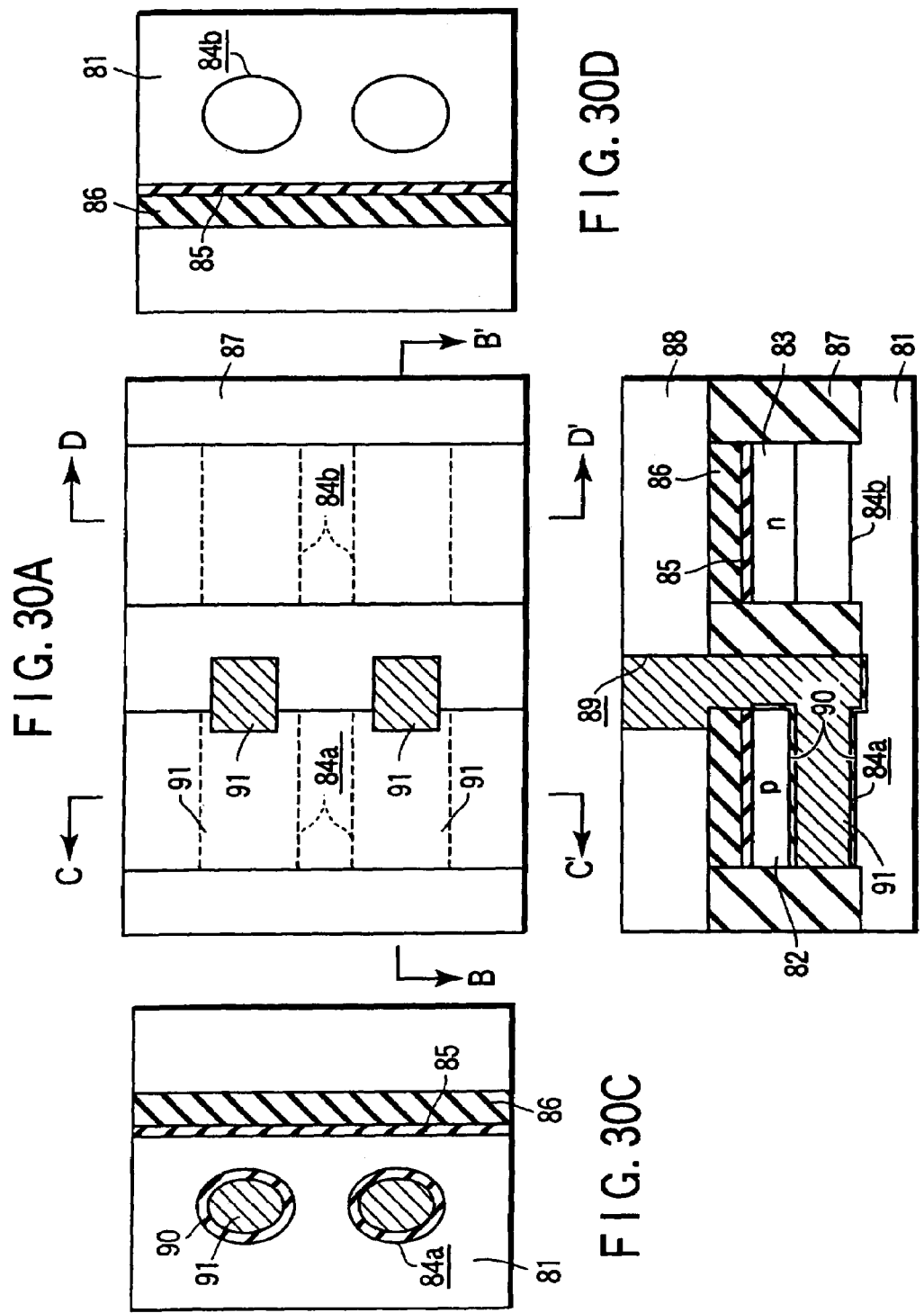

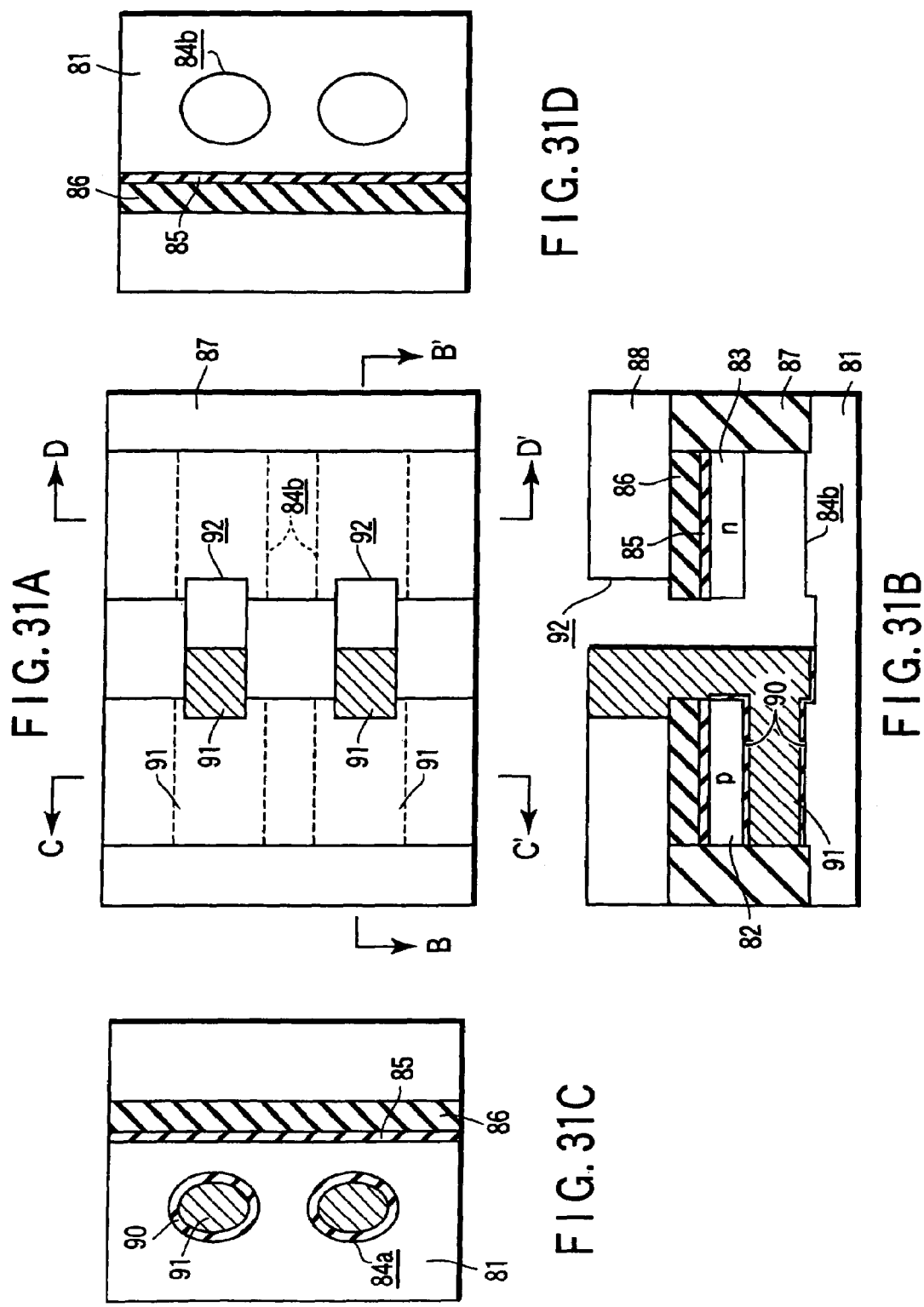

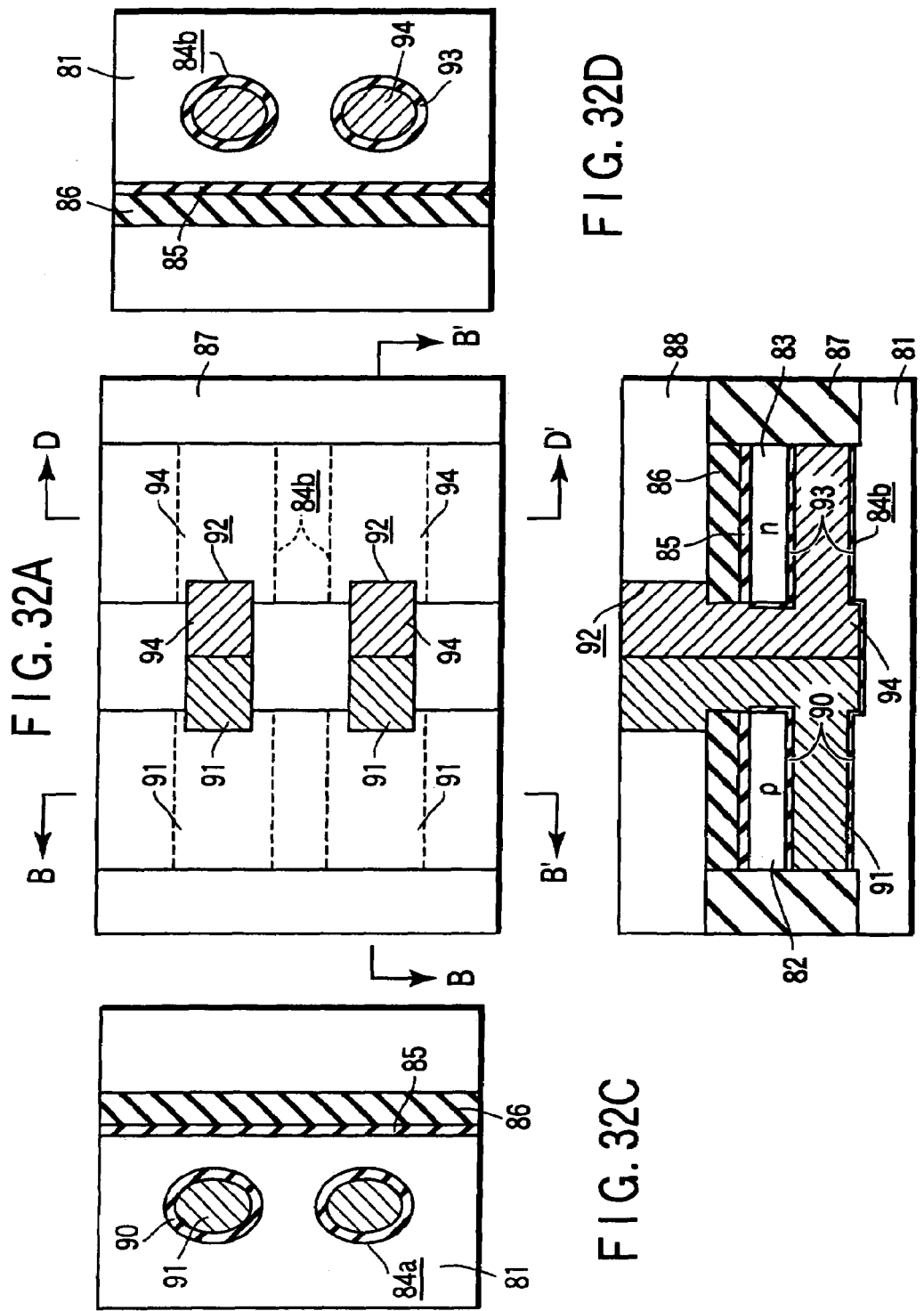

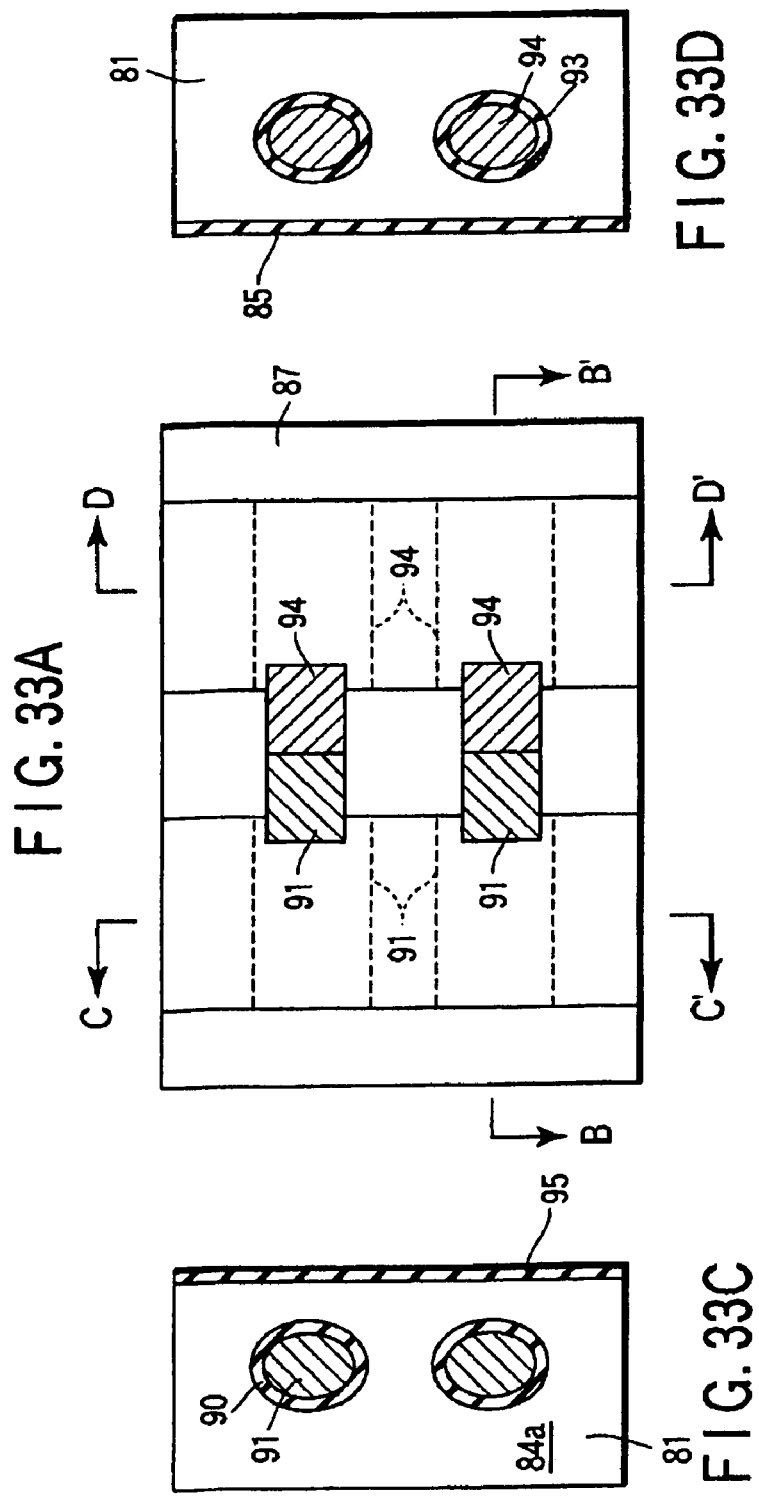
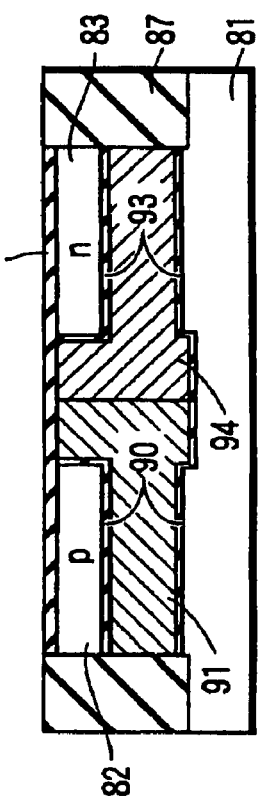
FIG. 33A
FIG. 33B
FIG. 33C
FIG. 33D

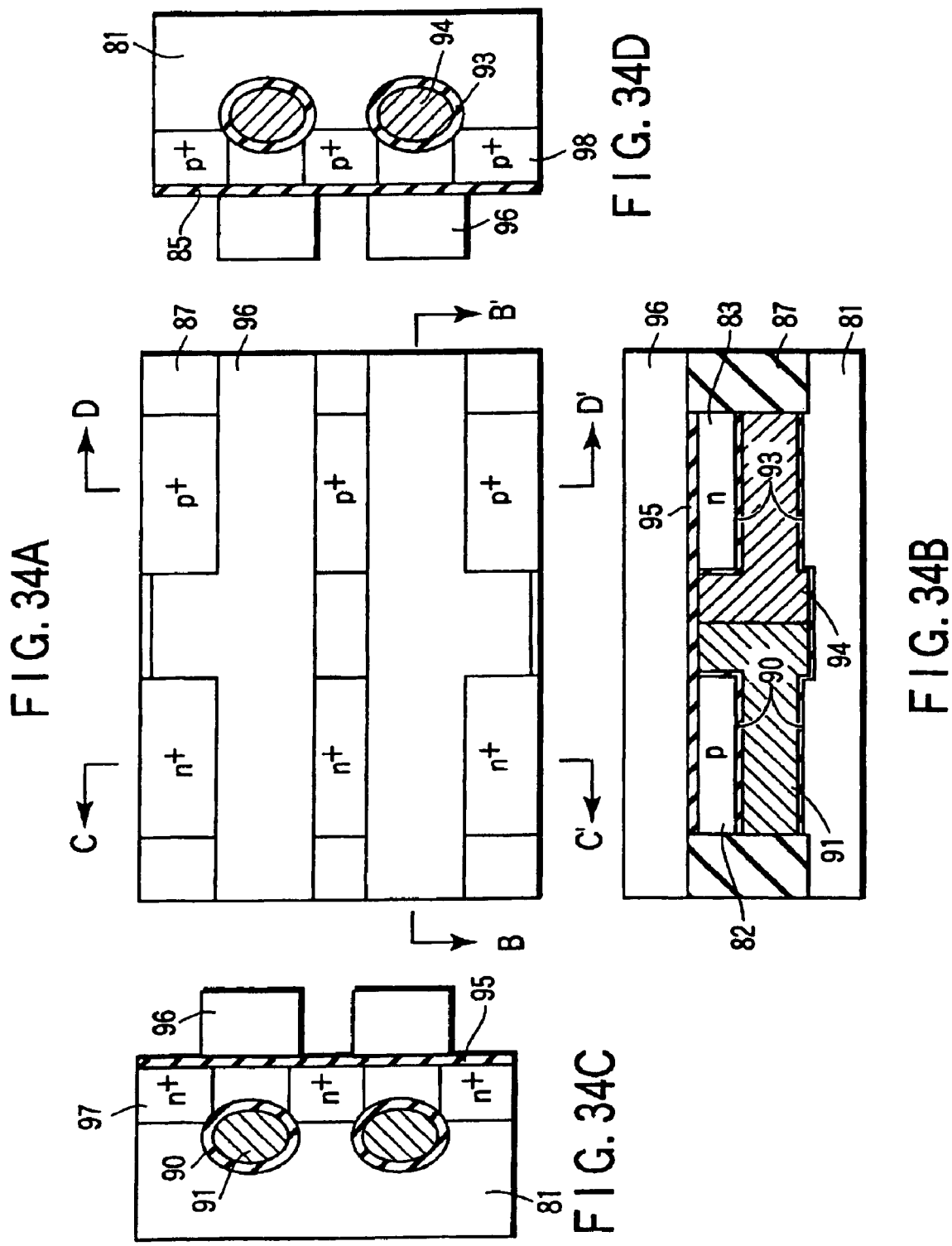

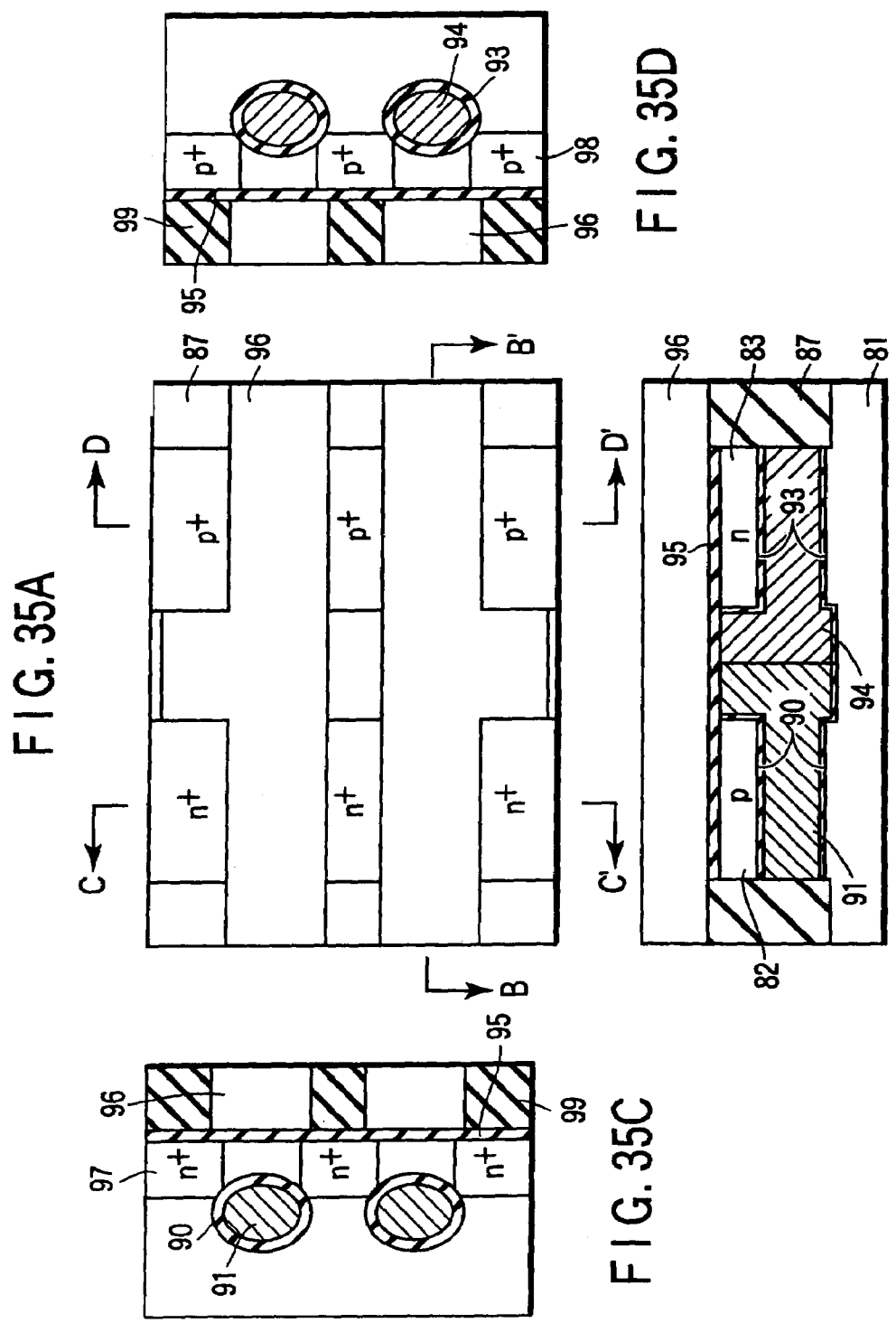

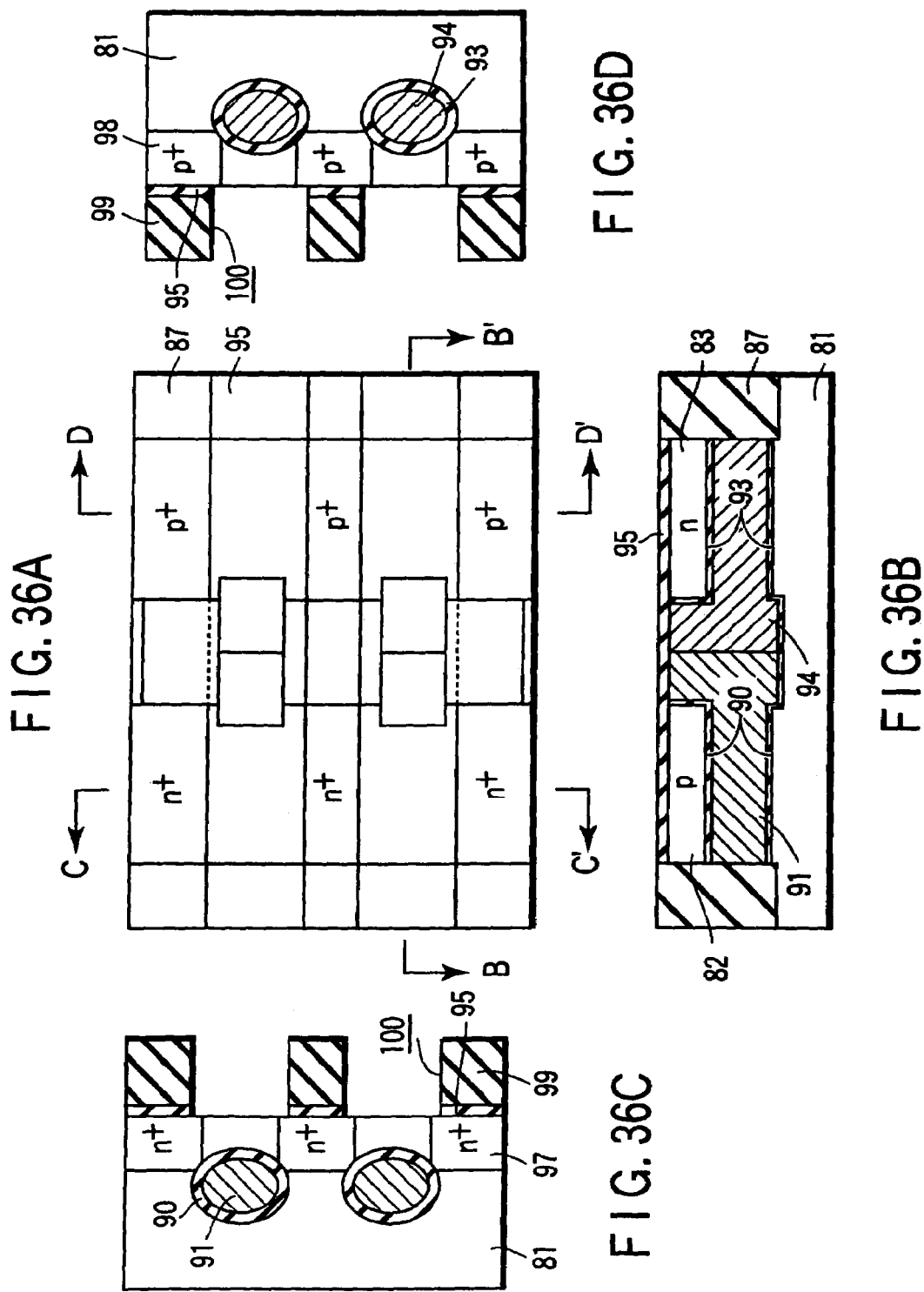

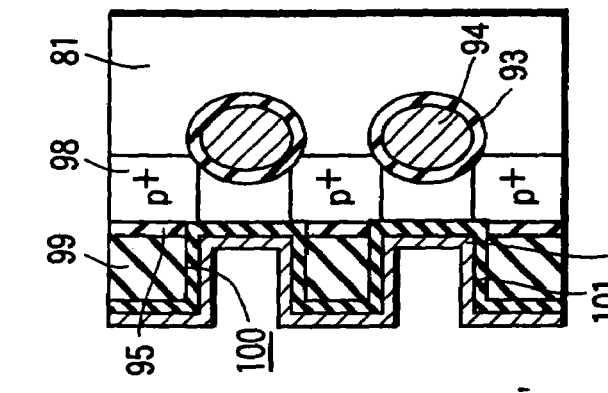
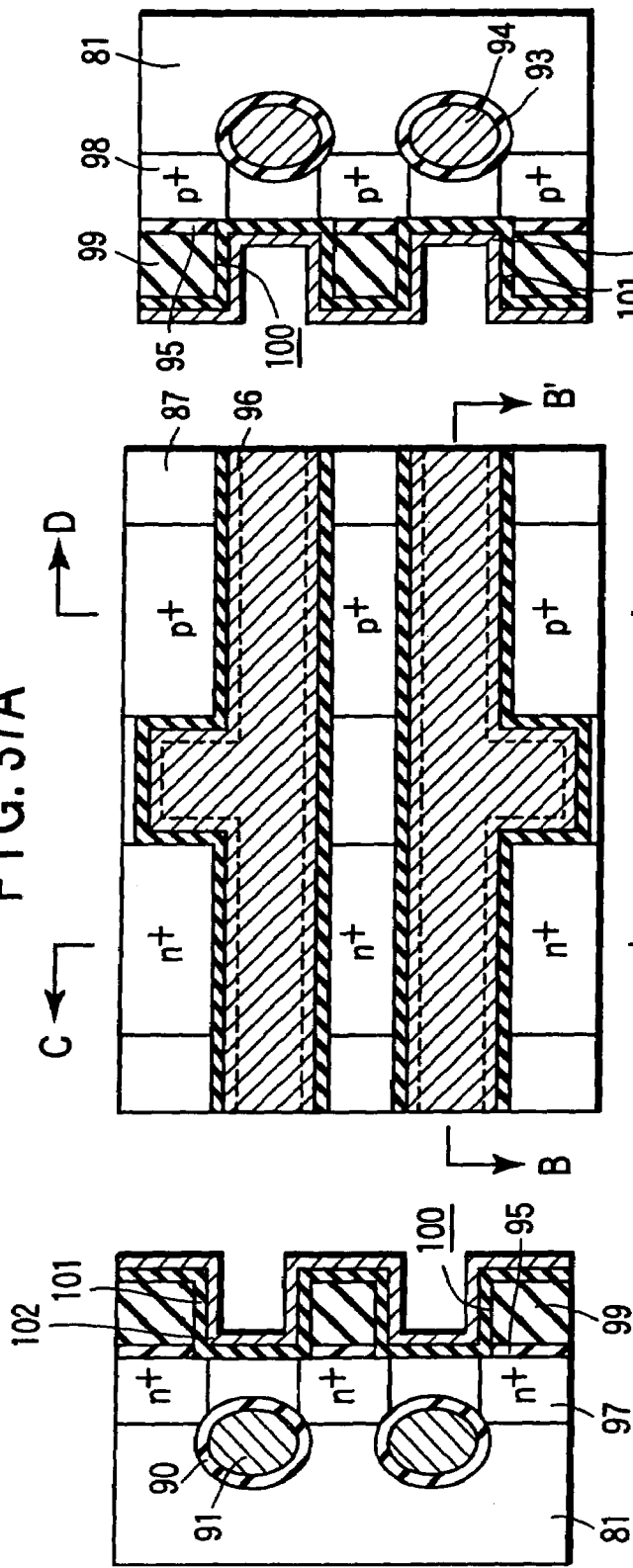
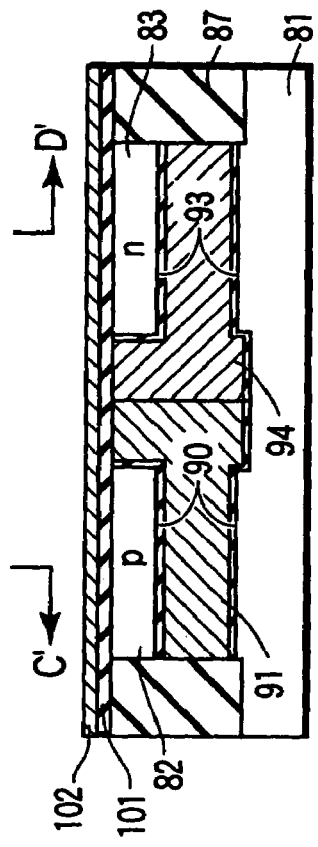
FIG. 37A  FIG. 37B  FIG. 37C  FIG. 37D

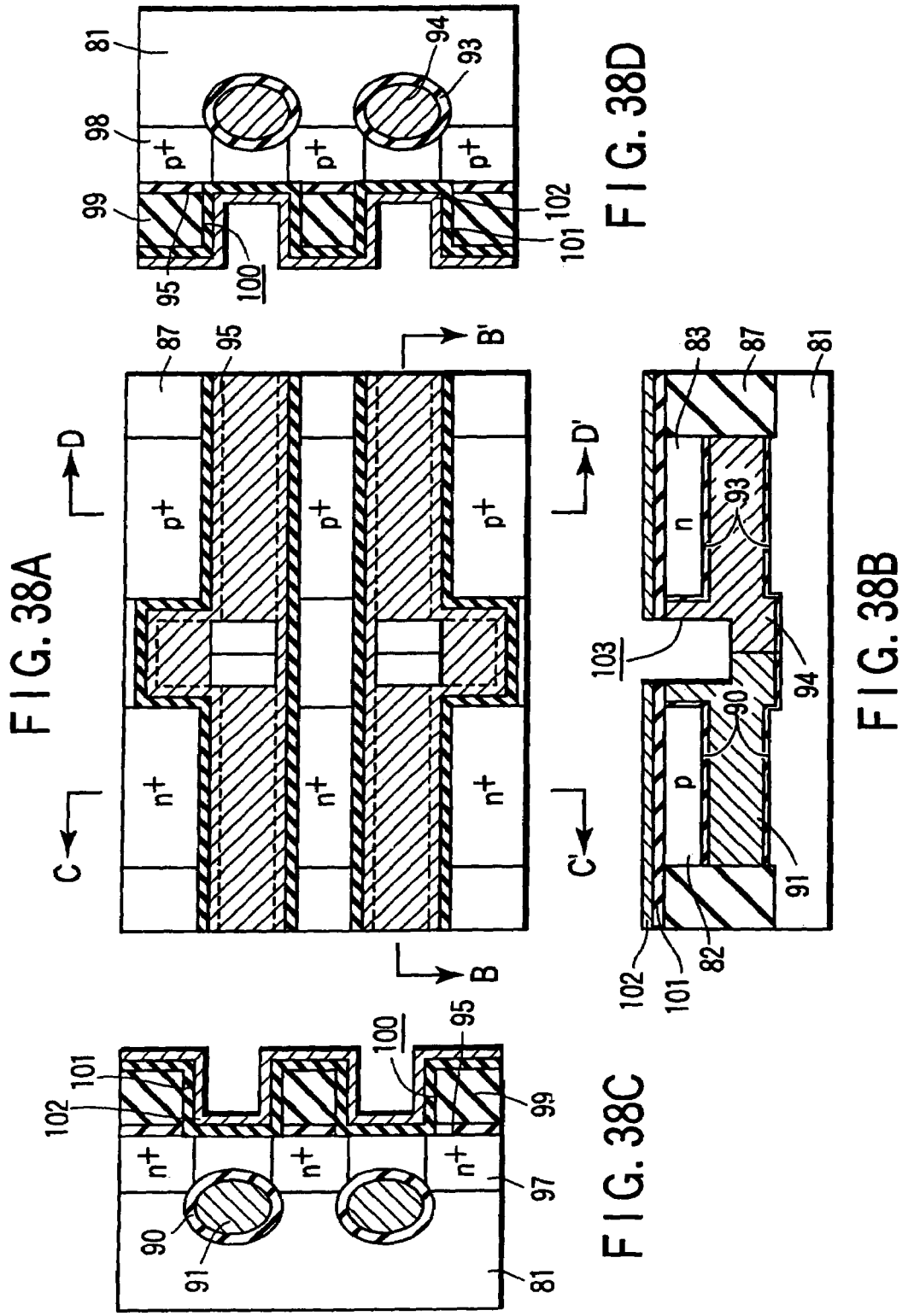

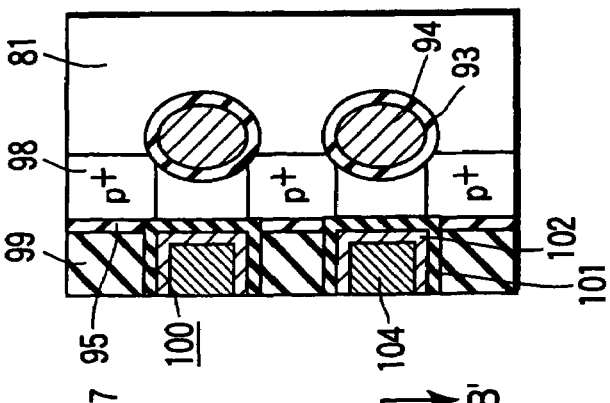
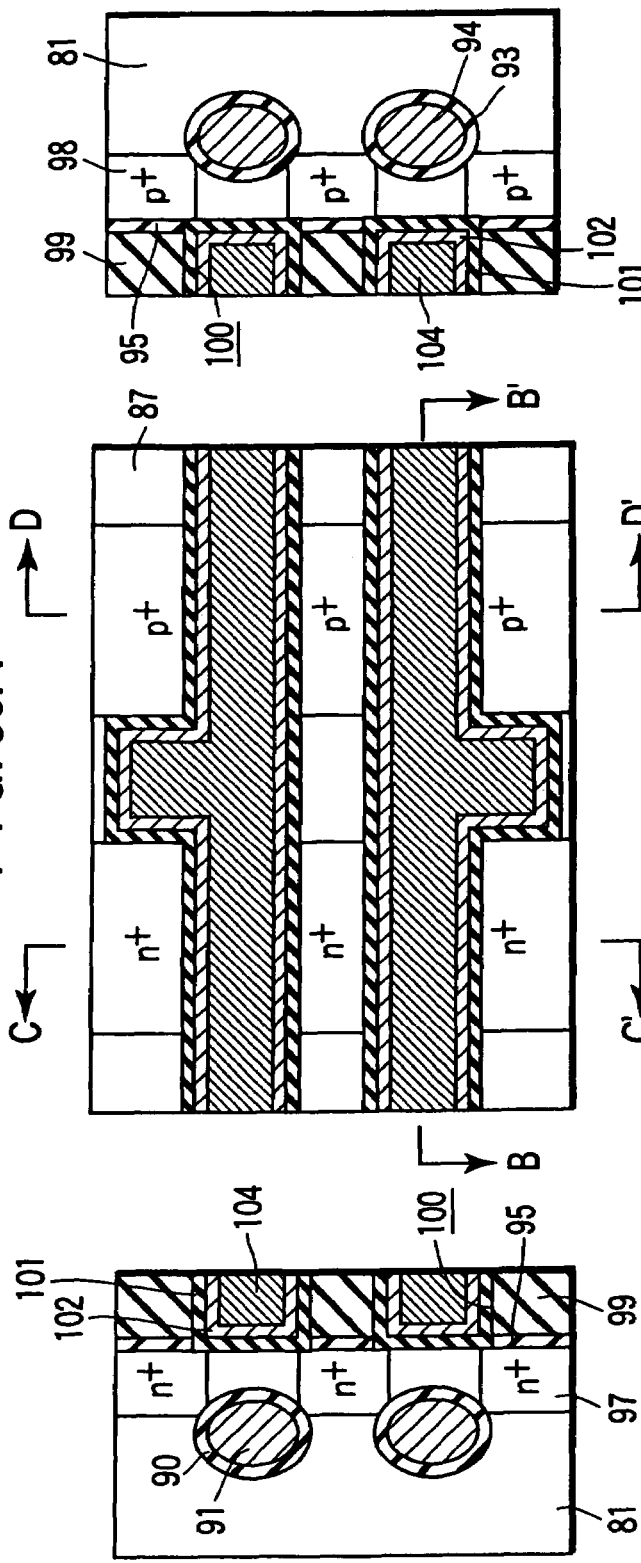
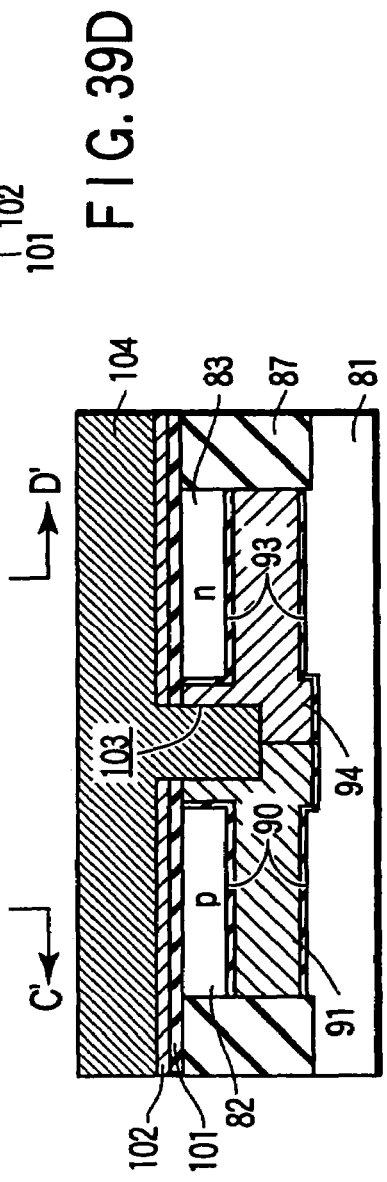
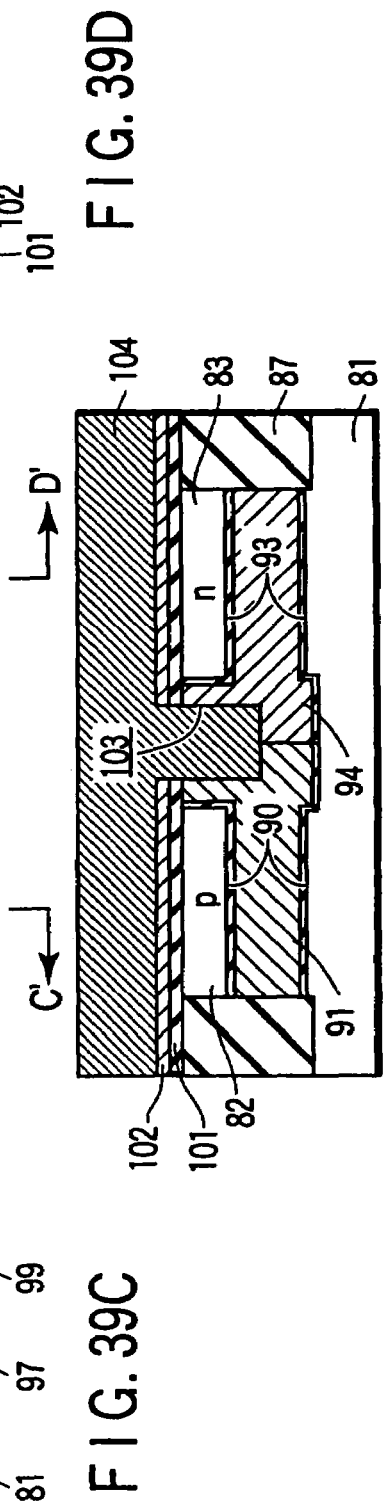

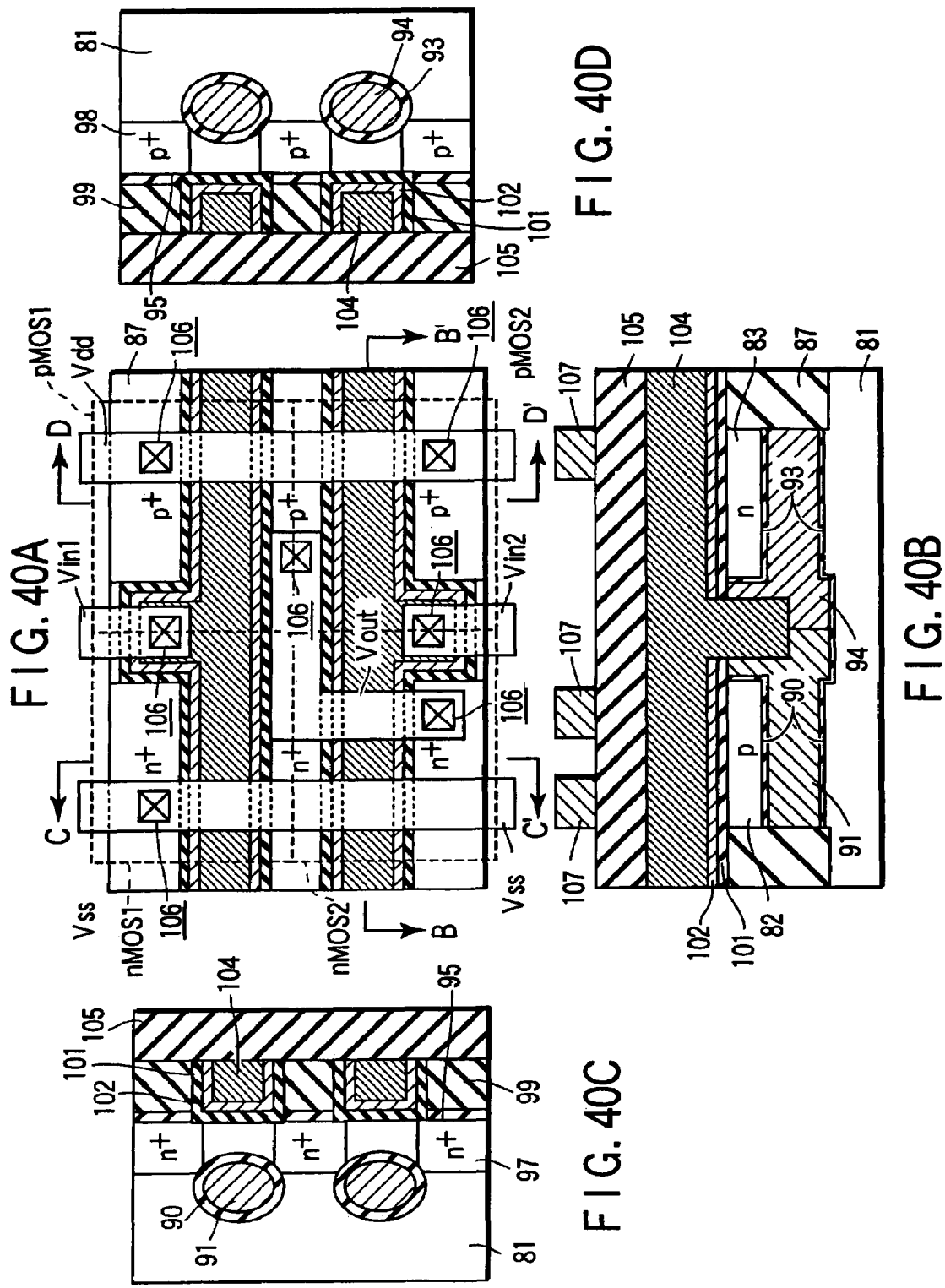

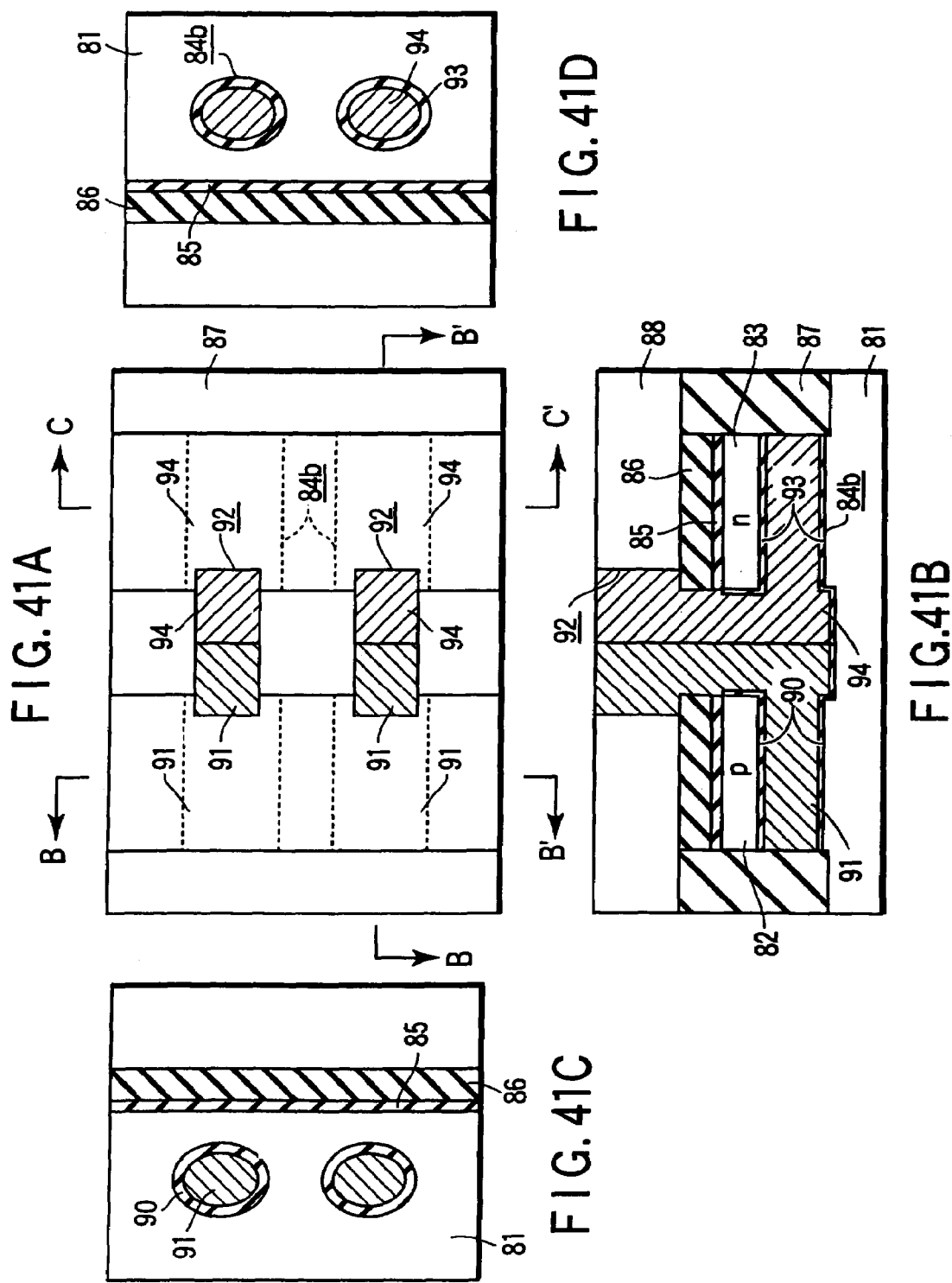

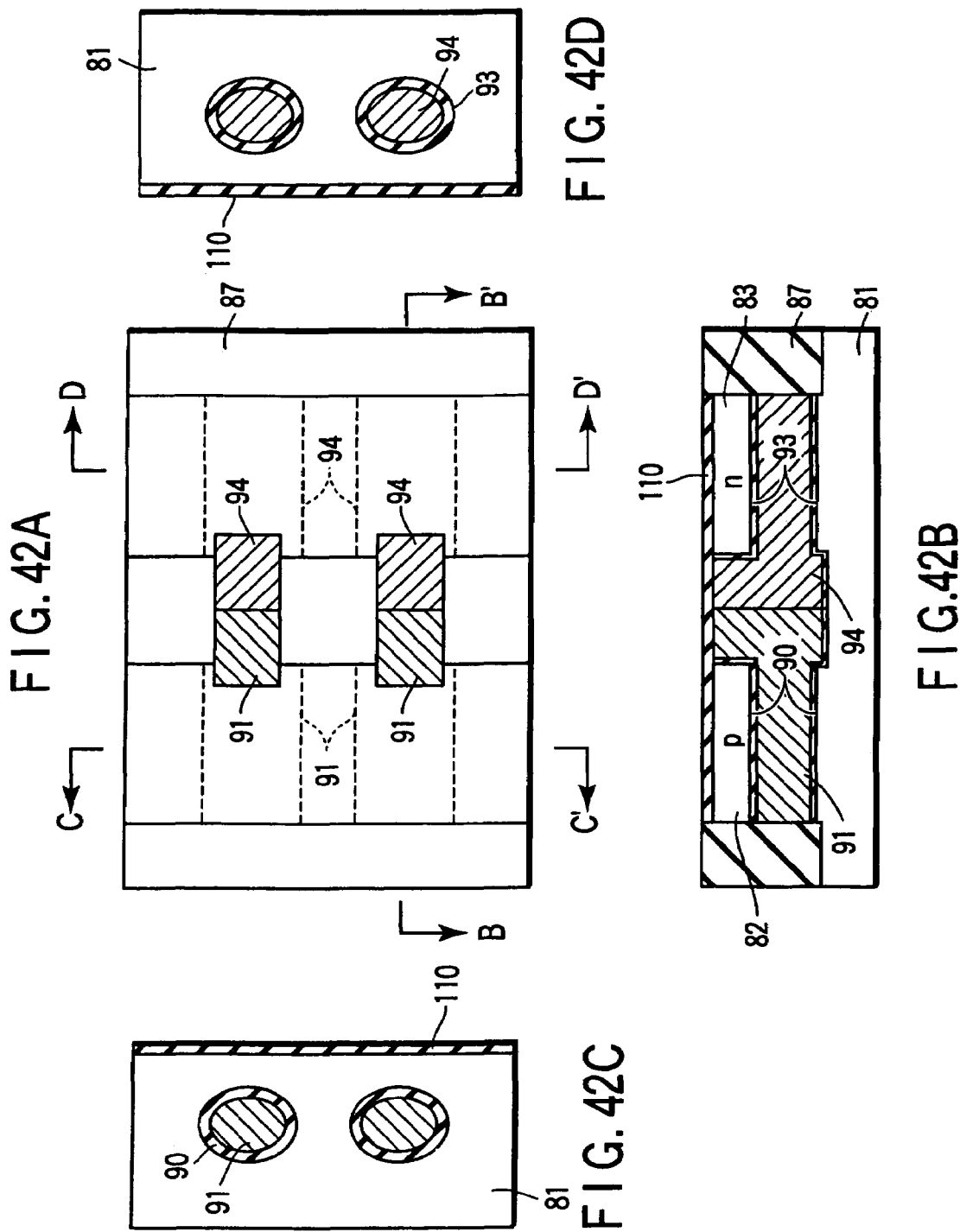

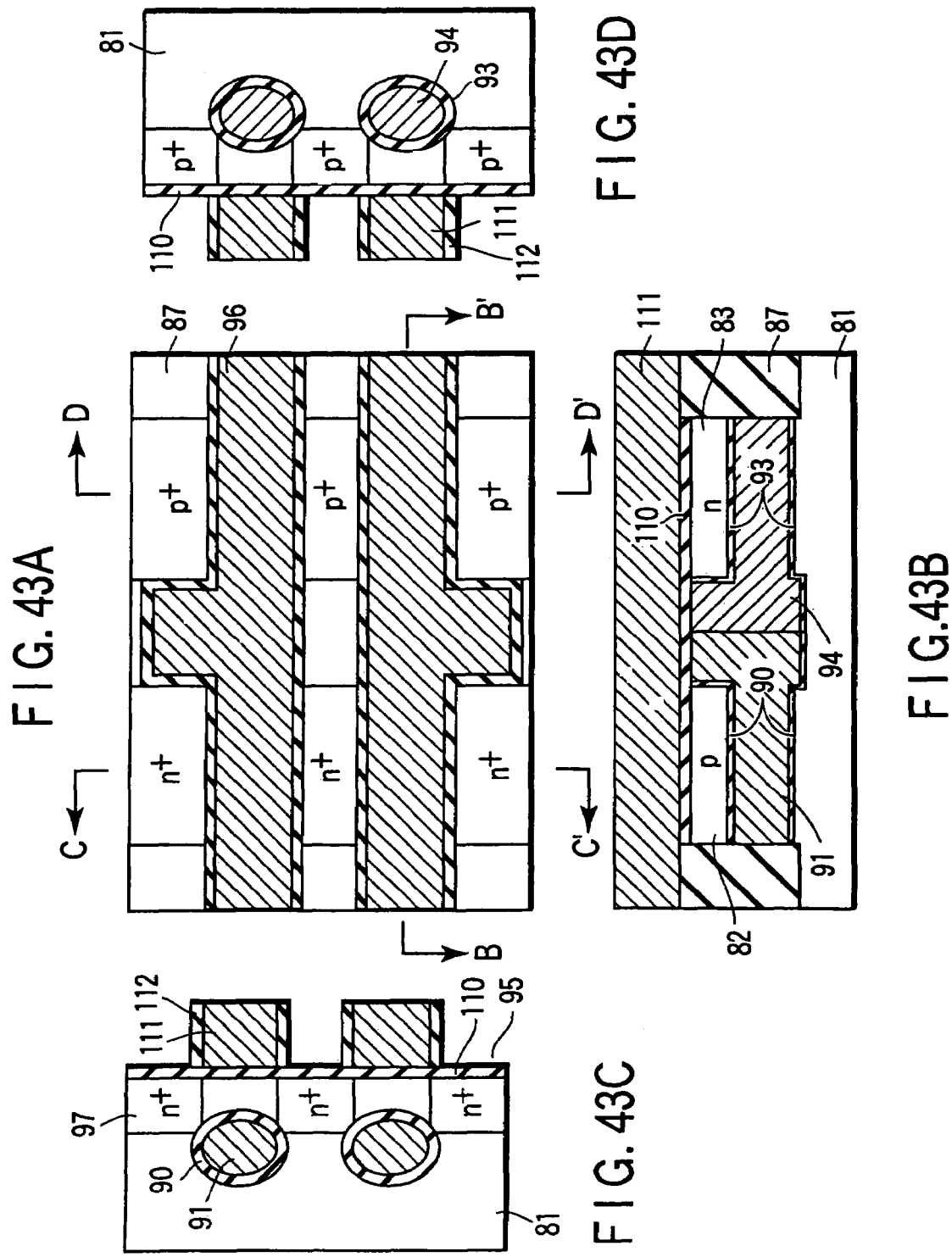

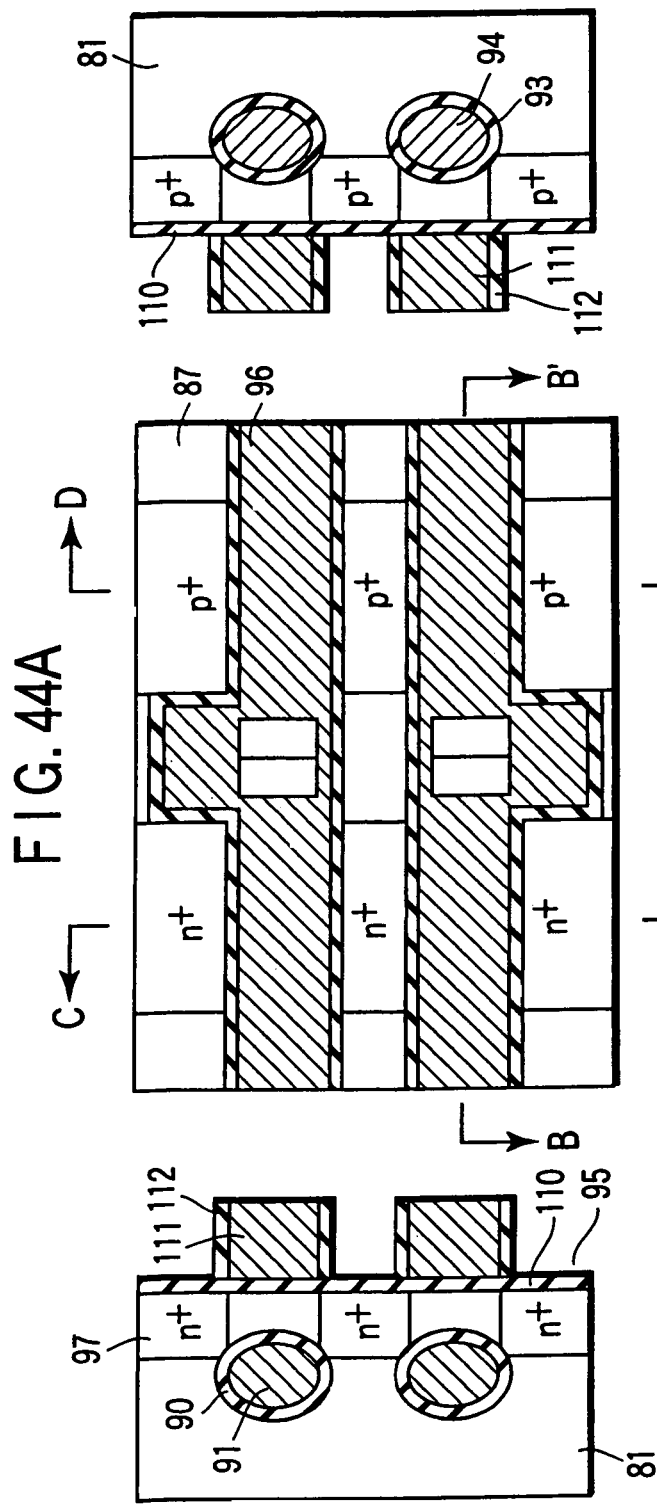
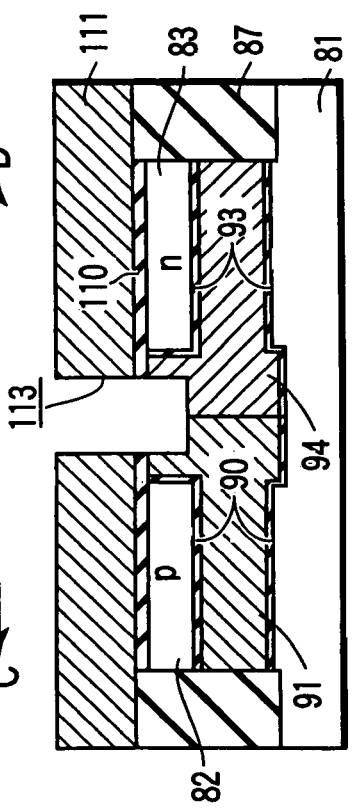

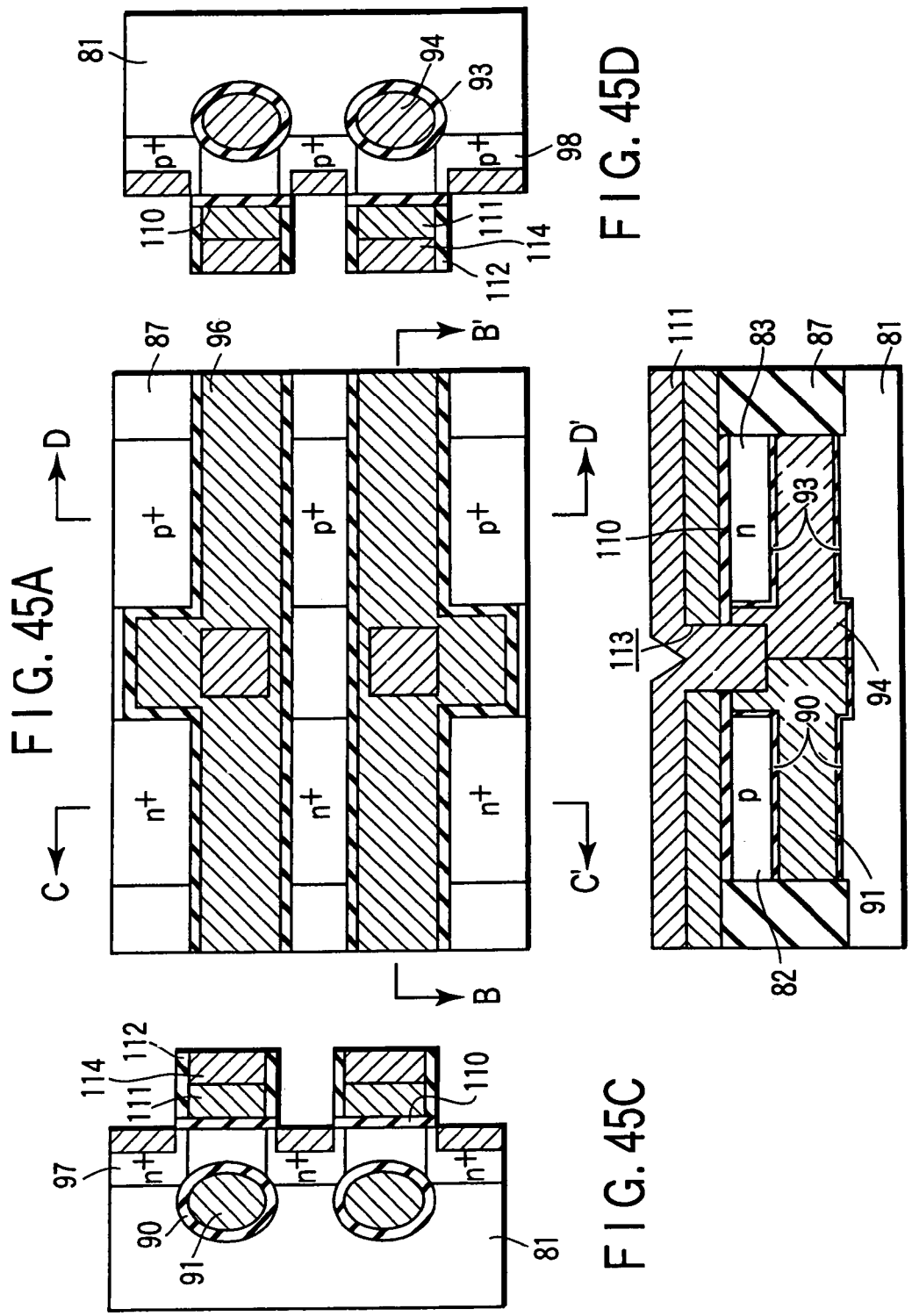

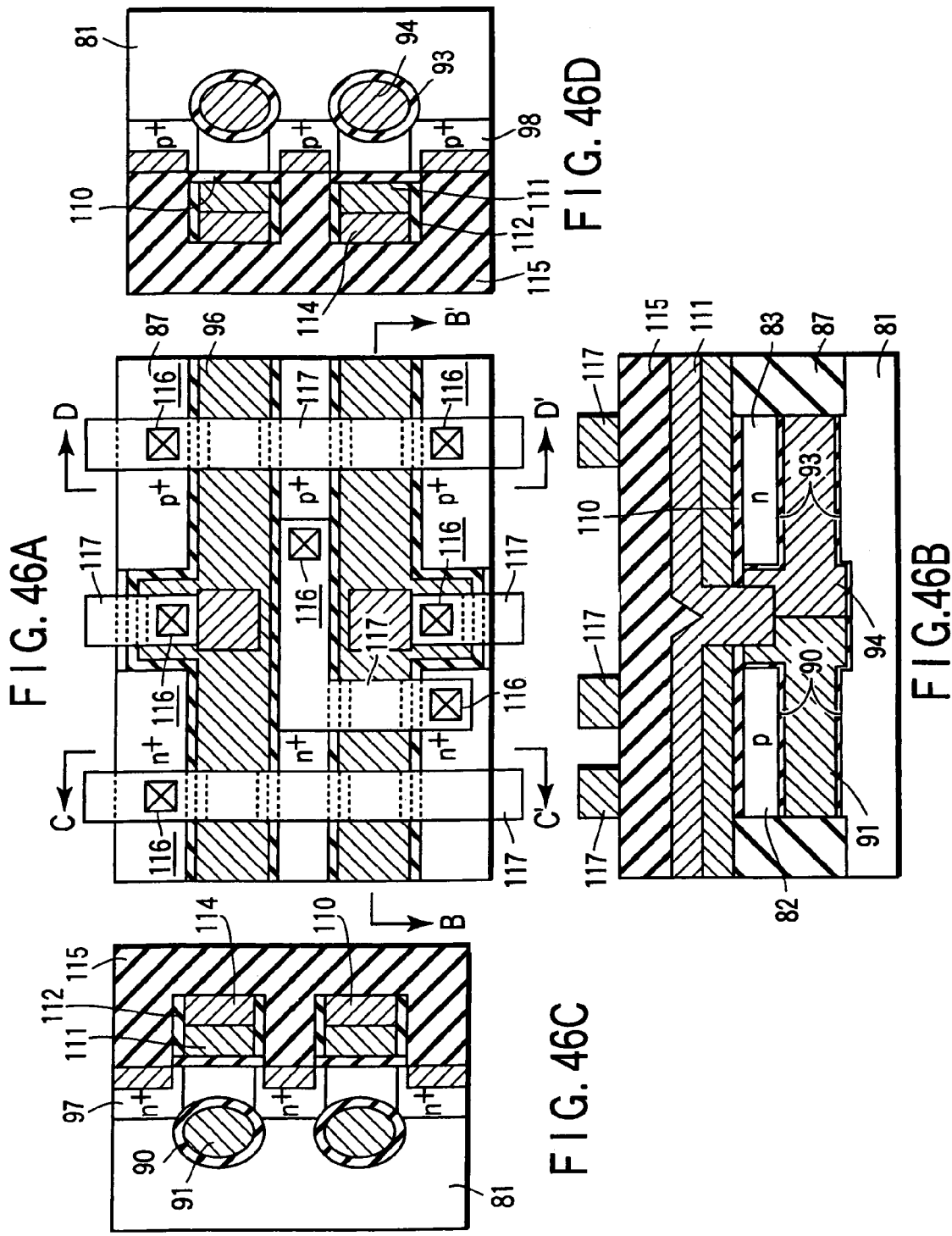

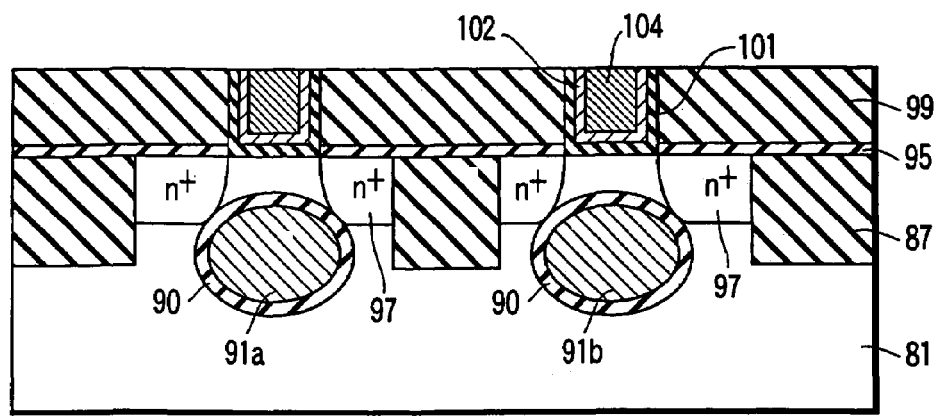
F I G. 47
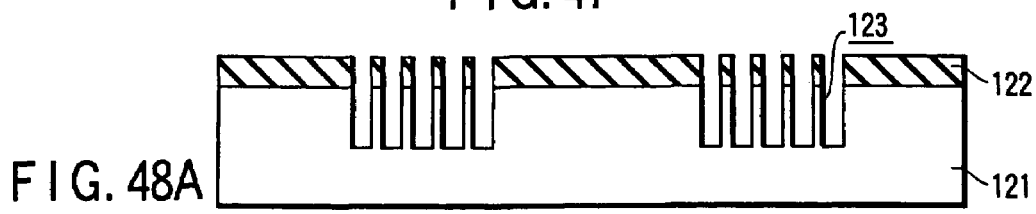
F I G. 48A
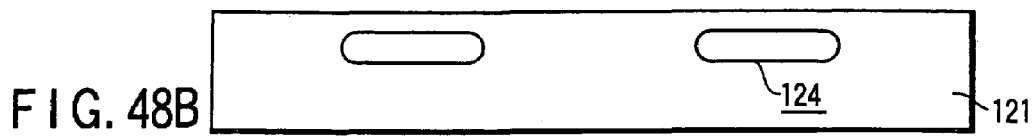
F I G. 48B
F I G. 48C
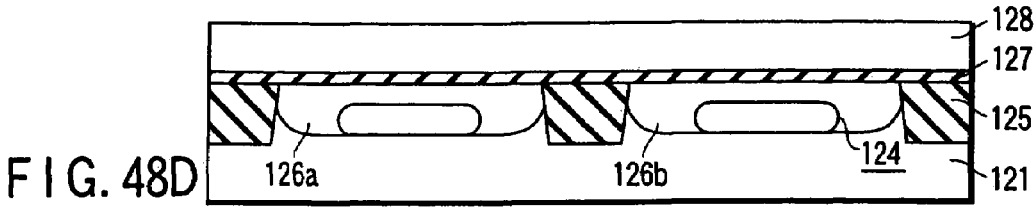
F I G. 48D
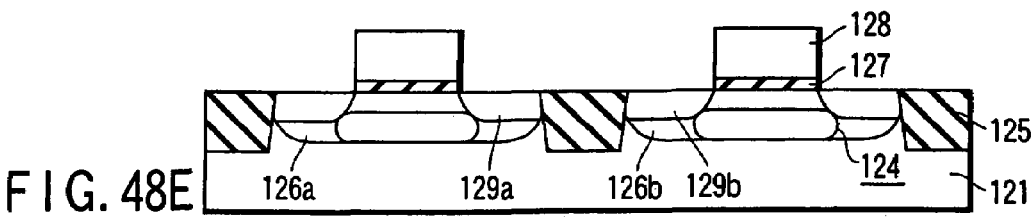
F I G. 48E
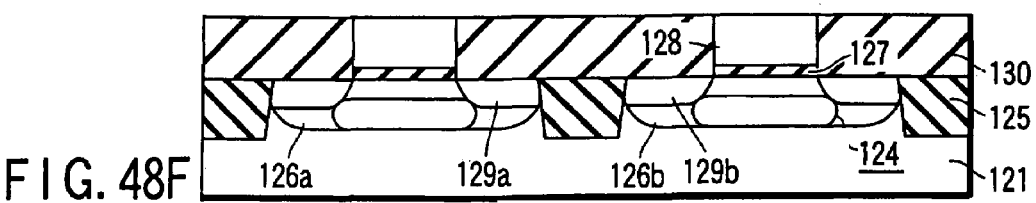
F I G. 48F

SEMICONDUCTOR DEVICE AND MANUFACTURING METHOD THEREOF

CROSS-REFERENCE TO RELATED APPLICATIONS

This application is division of U.S. application Ser. No. 11/137,539, filed May 26, 2005, now U.S. Pat. No. 7,208,353 which is a division of parent U.S. application Ser. No. 10/436,181 (now U.S. Pat. No. 6,979,846) filed May 13, 2003, both of which are incorporated herein by reference. This application is also based upon and claims the benefit of priority from Japanese Patent Application No. 2002-137268, filed May 13, 2002, the entire contents of which are incorporated herein by reference.

BACKGROUND OF THE INVENTION

1. Field of the Invention

The present invention relates to a semiconductor device and manufacturing method thereof, and particularly, to a MISFET having a lowered threshold voltage.

2. Description of the Related Art

To reduce power consumption of a MOSFET-LSI, conventionally, the power source voltage $V_{dd}$ has been reduced more and more. The threshold voltage $V_{th}$ of the MOSFET, however, has not been reduced much, in order to prevent increase of an OFF current. The drive performance Id of the transistor consequently tends to be lowered. A dynamic threshold voltage MOSFET (DTMOSFET) has been proposed as a device which overcomes the tendency (ref.: Fariborz Assaderaghi, et al, "Dynamic threshold-voltage MOSFET (DTMOS) for Ultra-Low voltage VLSI", IEEE Trans. Electron Devices, vol. 44, pp. 414-421, 1997).

The DTMOSFET is a MOSFET which electrically connects a gate with a well (which is an Si-body in an SOI substrate). This device has merits of a large driving performance and a small OFF current although the power source voltage $V_{dd}$ is small. The ground that results these merits will be explained by an operational principle as follows, which is specific to the DTMOSFET. The gate voltage is transmitted to the substrate, generating a substrate bias effect. Accordingly, the threshold voltage $V_{th}$ is low when the transistor is ON. When the transistor is off, the threshold voltage Vth is high.

This device has further merits as follows (ref.: A. Yagishita, et al., "Dynamic Threshold Voltage Damascene Metal Gate MOSFET (DT-DMG-MOS) with low threshold voltage, high drive current, and uniform electrical characteristics," IEDM Tech. Dig., pp. 663-666, 2000).

(1) The DTMOSFET has a small vertical electric field (in the direction vertical to channel surfaces) and large mobility. This is the reason why high driving performance is realized.

(2) The DTMOSFET fulfils an equation of $dV_g/dV_{ch}=1$. Therefore, the S-factor is constantly about 60 mV/decade in areas where no short channel effect is generated. This is an ideal value (which is the best value at room temperature).

(3) Variants of the threshold voltage can be reduced (variants of the threshold voltage: $\Delta V_{th1}$ (DTMOSFET)$<\Delta V_{th2}$ (normal MOSFET)).

There is however a problem that the substrate bias coefficient $\gamma$ ($=dV_{th}/dV_{bs}$) is difficult to increase.

As described above, the DTMOSFET has a problem that the substrate bias coefficient $\gamma$ cannot be increased and the threshold voltage cannot be further reduced.

BRIEF SUMMARY OF THE INVENTION (1) A semiconductor device according to an aspect of the invention comprises: a support layer made of a semiconductor; a diffusion layer formed by implanting impurities in a surface layer of the support layer; a buried insulating layer provided on the diffusion layer; an island-like active layer provided on the buried insulating layer; a channel region formed in the active layer; source and drain regions formed in the active layer, sandwiching the channel region; a gate insulating film formed on the channel region; a gate electrode formed on the gate insulating film and on side surfaces of the island-like active layer, and insulated and isolated from the channel region and source and drain regions; and an electrode connected to the active layer.

(2) A semiconductor device according to another aspect of the invention comprises: a semiconductor substrate; a channel region formed in the semiconductor substrate; a front gate insulating film formed on the channel region of the semiconductor substrate; a front gate electrode formed on the front gate insulating film; source and drain regions formed in the semiconductor substrate, sandwiching the channel region; a back gate electrode formed in the semiconductor substrate, under the first gate electrode, electrically connected to the front gate electrode, and having a different work function from that of the front gate electrode; and a back gate insulating film formed on a surface of the second gate electrode opposed to the front gate insulating film.

(3) A method of manufacturing a semiconductor device forming a MISFET, according to further another aspect of the invention, comprises steps of: preparing an SOI substrate in which a support substrate made of a semiconductor, a buried insulating film, and a semiconductor layer are stacked one after another; implanting impurities into a surface layer of the support substrate, which contacts the buried insulating film, to form a diffusion layer; selectively etching the semiconductor layer except for regions including source and drain regions and a channel region of the MISFET, to form an upper structure in which the source and drain regions and the channel region are formed insides; forming a sidewall insulating film on side surfaces of the upper structure; selectively etching the semiconductor layer exposed from side portions of the sidewall insulating film, to expose the buried insulating film, and to form a lower structure under the upper structure, a top surface of the lower structure exposed from side portions of the side surfaces of the upper structure; forming an insulating layer on the buried insulating film around the lower structure, and sidewall insulating film; forming a dummy gate in a channel region on the upper structure; selectively implanting impurities into portions of the upper structure which are not covered with the dummy gate, to form the source and drain regions; forming an interlayer insulating film around the dummy gate; selectively removing the dummy gate, to form a gate groove having sidewalls made of the interlayer insulating film and exposing the channel region; forming a gate insulating film on the upper structure of a bottom of the gate groove; partially etching the gate insulating film and gate insulating layer at the bottom of the gate groove, to form a hole which exposes partially side surfaces of the lower structure; forming gate electrodes in the gate groove and the hole; partially etching the interlayer insulating film, insulating layer, and buried insulating film to form a contact hole connected to the diffusion layer; and forming an upper wire in the contact hole.

(4) A method of manufacturing a semiconductor device forming a MISFET, according to further another aspect of the invention, comprises steps of: forming a cavity inside a semiconductor substrate; forming a hole in the semiconductor substrate, the hole connected to the cavity; forming a back gate insulating film on surfaces of the semiconductor substrate which are exposed from surfaces of the cavity and hole; forming a back gate electrode in the cavity and hole having surfaces covered with the back gate insulating film; forming a dummy gate in a channel region on the upper structure of the MISFET; implanting impurities into portions of the semiconductor substrate which are not covered with the dummy gate, to form source and drain regions; forming an interlayer insulating film around the dummy gate; selectively removing the dummy gate, to form a gate groove having sidewalls made of the interlayer insulating film and exposing the semiconductor substrate and the back gate electrode; forming a front gate insulating film at a bottom surface of the gate groove; partially etching the front gate insulating film at the bottom surface of the gate groove, to form a contact hole connected to the back gate electrode; and forming a front gate electrode having a different work function from that of the back gate electrode in the gate groove and contact hole.

(5) A method of manufacturing a semiconductor device forming a MISFET, according to further another aspect of the invention, comprises steps of: forming a cavity inside a semiconductor substrate; forming a hole in the semiconductor substrate, the hole connected to the cavity; forming a back gate insulating film on surfaces of the semiconductor substrate which are exposed from surfaces of the cavity and hole; forming a back gate electrode in the cavity and hole having surfaces covered with the back gate insulating film; forming a front gate insulating film on the semiconductor substrate; forming a front gate electrode on the front gate insulating film on the MISFET channel region, the front gate electrode having a different work function from that of the back gate electrode; selectively implanting impurities into portions of the semiconductor substrate which are not covered with the front gate electrode; partially etching the front gate electrode and front gate insulating film, to form a hole connected to the back gate electrode; and forming electrodes in the hole and on the front gate electrode.

BRIEF DESCRIPTION OF THE SEVERAL VIEWS OF THE DRAWING

FIGS. 7A and 7B are cross-sectional views showing a step of manufacturing the semiconductor device according to the second embodiment;

FIGS. 8A and 8B are cross-sectional views showing a step of manufacturing the semiconductor device according to the second embodiment;

FIGS. 9A and 9B are cross-sectional views showing a step of manufacturing the semiconductor device according to the second embodiment;

FIGS. 16A and 16B are cross-sectional views showing a step of manufacturing the semiconductor device according to the second embodiment;

FIGS. 17A and 17B are cross-sectional views showing an operational state of the semiconductor device according to the second embodiment;

FIG. 23 is a circuit diagram showing the structure of a CMOSFET inverter using a DTMOSFET according to the seventh embodiment;

FIG. 24 is a circuit diagram showing the structure of a 2-input NAND circuit frequently used in a logic circuit according to the seventh embodiment;

FIG. 25 is a truth-value table of the two-input NAND circuit shown in FIG. 24;

FIGS. 27A to 27D are views showing a step of manufacturing the two-input NAND circuit using the DTCMOSFET according to the seventh embodiment;

FIGS. 28A to 28D are views showing a step of manufacturing the two-input NAND circuit using the DTCMOSFET according to the seventh embodiment;

FIGS. 29A to 29D are views showing a step of manufacturing the two-input NAND circuit using the DTCMOSFET according to the seventh embodiment;

FIGS. 30A to 30D are views showing a step of manufacturing the two-input NAND circuit using the DTCMOSFET according to the seventh embodiment;

FIGS. 31A to 31D are views showing a step of manufacturing the two-input NAND circuit using the DTCMOSFET according to the seventh embodiment;

FIGS. 32A to 32D are views showing a step of manufacturing the two-input NAND circuit using the DTCMOSFET according to the seventh embodiment;

FIGS. 33A to 33D are views showing a step of manufacturing the two-input NAND circuit using the DTCMOSFET according to the seventh embodiment;

FIGS. 34A to 34D are views showing a step of manufacturing the two-input NAND circuit using the DTCMOSFET according to the seventh embodiment;

FIGS. 35A to 35D are views showing a step of manufacturing the two-input NAND circuit using the DTCMOSFET according to the seventh embodiment;

FIGS. 36A to 36D are views showing a step of manufacturing the two-input NAND circuit using the DTCMOSFET according to the seventh embodiment;

FIGS. 37A to 37D are views showing a step of manufacturing the two-input NAND circuit using the DTCMOSFET according to the seventh embodiment;

FIGS. 38A to 38D are views showing a step of manufacturing the two-input NAND circuit using the DTCMOSFET according to the seventh embodiment;

FIGS. 39A to 39D are views showing a step of manufacturing the two-input NAND circuit using the DTCMOSFET according to the seventh embodiment;

FIGS. 40A to 40D are views showing a step of manufacturing the two-input NAND circuit using the DTCMOSFET according to the seventh embodiment;

FIGS. 41A to 41D are views showing a step of manufacturing the two-input NAND circuit using the DTCMOSFET according to the eighth embodiment;

FIGS. 42A to 42D are views showing a step of manufacturing the two-input NAND circuit using the DTCMOSFET according to the eighth embodiment;

FIGS. 43A to 43D are views showing a step of manufacturing the two-input NAND circuit using the DTCMOSFET according to the eighth embodiment;

FIGS. 44A to 44D are views showing a step of manufacturing the two-input NAND circuit using the DTCMOSFET according to the eighth embodiment;

FIGS. 45A to 45D are views showing a step of manufacturing the two-input NAND circuit using the DTCMOSFET according to the eighth embodiment;

FIGS. 46A to 46D are views showing a step of manufacturing the two-input NAND circuit using the DTCMOSFET according to the eighth embodiment;

FIG. 47 is a cross-sectional view showing the structure of a metal gate DT-nMOSFET according to the ninth embodiment;

FIGS. 48A to 48K are cross-sectional views showing steps of manufacturing a semiconductor device according to the tenth embodiment;

DETAILED DESCRIPTION OF THE INVENTION

Embodiments of the present invention will now be described with reference to the drawings.

Generally in a DTMOSFET, a gate and a well (or the Si body in an SOI substrate) are connected, and the well is used as a back gate. A gate insulating film of the back gate is a depletion layer. To reduce a threshold voltage Vth, a substrate bias coefficient $\gamma = |dVth/dVbs| = Cdep/Cox$ must be increased. In this equation, Vbs represents a back bias voltage, and Cdep represents depletion layer capacitance of the depletion layer. Cox represents gate insulating film capacitance.

More specifically, the depletion layer capacitance Cdep may be increased in order to increase the substrate bias coefficient $\gamma$. Hence, impurity concentration of the well may be increased to be high while thickness of the depletion layer may be reduced. If the impurity concentration of the well is simply increased, however, there is a problem that the threshold voltage increases. A technique for stepping an impurity profile of a channel is therefore effective in this case. That is, it is necessary that the impurity concentration is low at the channel surface and changes step by step to be higher deep in the channel (where the depth>several tens nm). The substrate bias coefficient $\gamma$ ($=dVth/dVbs$) can be increased while restricting the threshold voltage to a low value.

Formation of this stepped channel profile is however difficult. This is because a $\delta$ doping technique is necessary to form this profile and the temperature of a thermal process after formation of the channel must be as low as possible.

Figure 1A:
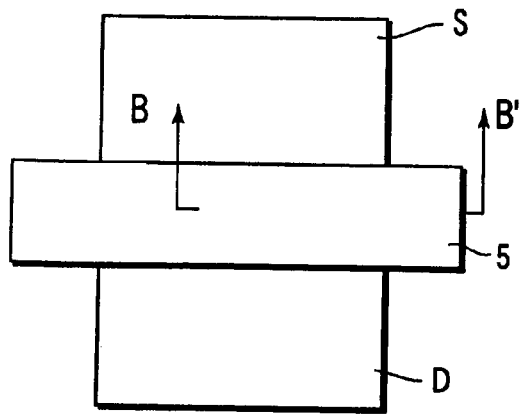
FIGS. 1A and 1B are views showing the structure of a semiconductor device according to the first embodiment of the present invention.
Figure 1B:
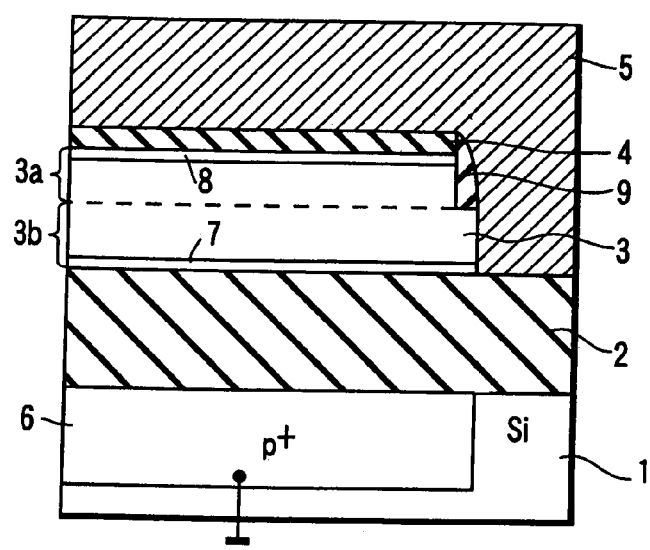

The present invention hence proposes a DTMOSFET having a structure as shown in FIGS. 1A and 1B. FIGS. 1A and 1B show the structure of a semiconductor device according to the first embodiment of the present invention. FIG. 1A is a plan view and FIG. 1B is a cross-sectional view cut B-B' in FIG. 1A.

The present device uses an SOI substrate in which an Si support substrate 1, a buried oxide film 2, and an Si active layer 3 are stacked, as shown in FIGS. 1A and 1B. A $p^+$-diffusion layer 6 contacting the buried oxide film 2 is formed at the surface of the Si support substrate 1. The Si active layer 3 of P-type is constituted by a lower structure 3b and an upper structure 3a. The upper structure 3a is formed on the lower structure 3b and has a smaller cross-section parallel to the main surface of the Si support substrate 1 than the lower structure 3b. A sidewall insulating film 9 is formed on each side surface of the upper structure 3a. A gate insulating film 4 is formed on a channel region of the upper structure 3a of the Si active layer 3. A metal gate electrode 5 is formed, covering the top of the gate insulating film 4, the surface of each sidewall insulating film 9, and each side surface of the lower structure 3b. A source S and a drain D are formed in the upper structure 3a of the Si active layer 3, sandwiching the metal gate electrode 5.

When a voltage is applied to the gate electrode 5, a channel 8 is formed on the surface of the upper structure 3a. By applying an electric field from a $p^+$-diffusion layer 6 formed under the buried oxide film 2, an EIB (Electrically Induced Body, accumulated positive holes or electrons) 7 is electrically induced at the back interface of the Si active layer 3. The EIB 7 thus electrically induced and the metal gate electrode 5 at side surface portions of the lower structure 3b are electrically connected.

In this manner, the following merits are attained.

(1) The substrate bias coefficient $\gamma$ can be increased since a structure equivalent to an ideal stepped channel profile can be formed electrically. As a result, a further reduction of the threshold voltage can be achieved.

That is, an effect of improvement in performance of the DTMOSFET can be exhibited to the maximum.

(2) Electrically induced carriers at a high concentration electrically connect the Si semiconductor layer 3 with the metal gate electrode 5. Therefore, the contact resistance can be reduced without forming an impurity diffusion layer at a high concentration on side surfaces of the Si semiconductor layer.

(3) Connection between the gate electrode 5 and the Si active layer 3 is carried out by: the side surfaces of the Si active layer 3. Therefore, a plan layout area of the contact part can be reduced.

(4) Operation characteristics as a DTMOSFET provides S factor=60 mV/decade (an ideal value), a low threshold voltage, high mobility, and high driving force.

(5) Due to the operation principles of the DTMOSFET, variations in the threshold voltage can be restricted, even if the thickness of channel varies.

SECOND EMBODIMENT

The second embodiment will specifically describe a method of manufacturing the semiconductor device shown in FIGS. 1A and 1B according to the first embodiment.

Figure 2:
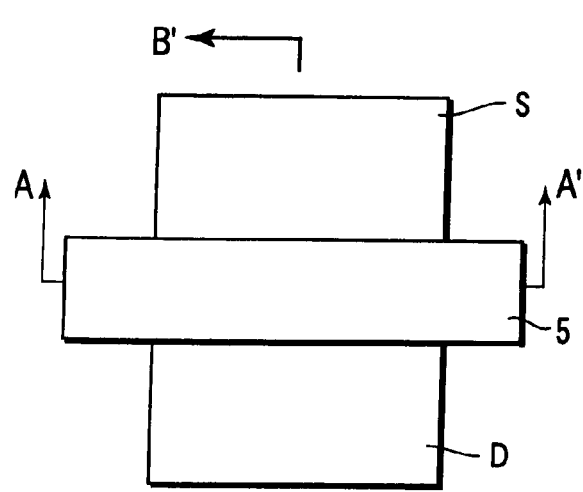
FIG. 2 is a plan view showing the structure of a semiconductor device according to, the second embodiment of the present invention.

FIG. 2 is a plan view showing the structure of a semiconductor device according to the second embodiment of the present invention. FIGS. 3A and 3B to 16A and 16B are cross-sectional views showing steps of manufacturing a semiconductor device according to the second embodiment of the present invention. FIGS. 3A to 16A are cross-sections cut along A-A' in FIG. 2. FIGS. 3B to 16B are cross-sections cut along B-B' in FIG. 2.

Figure 3A:
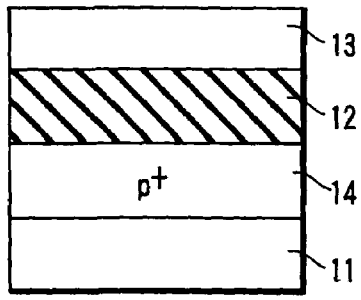
FIGS. 3A and 3B are cross-sectional views showing a step of manufacturing the semiconductor device according to the second embodiment.
Figure 3B:
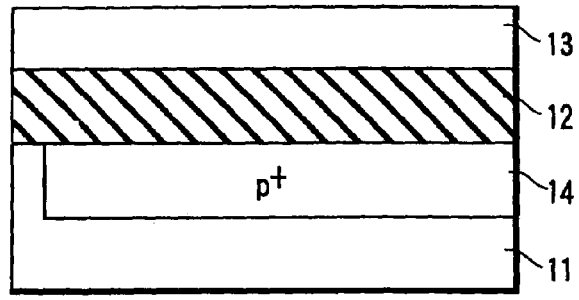

A description will now be given in the order of manufacturing steps. At first, as shown in FIGS. 3A and 3B, an SOI substrate is prepared including an Si support substrate 11, a buried oxide film 12, and an Si active layer 13. The Si active layer 13 has a thickness of 60 nm, for example. Next, boron is ion-implanted into the Si active layer 13 and the Si support substrate 11. A $p^+$-high-concentration impurity layer 14 is formed on the surface layer of the silicon substrate 11 under the buried oxide film 12.

Figure 4A:
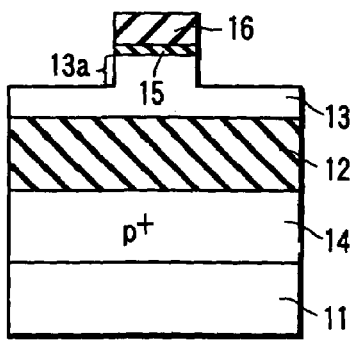
FIGS. 4A and 4B are cross-sectional views showing a step of manufacturing the semiconductor device according to the second embodiment.
Figure 4B:
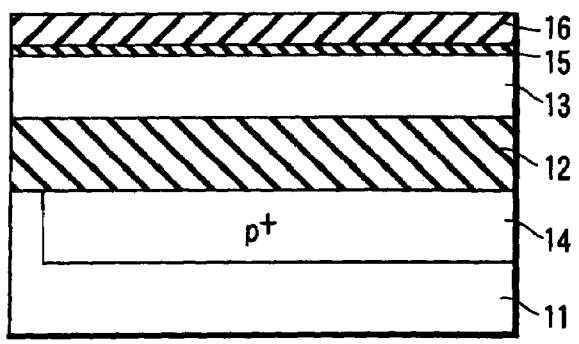

Subsequently, as shown in FIGS. 4A and 4B, a silicon oxide film 15 having a thickness of about 5 nm and a silicon nitride film 16 having a thickness of about 100 nm are sequentially formed on the Si active layer 13. Further, the silicon oxide film 15 and the silicon nitride film 16 are subjected to patterning so that source, drain, and channel regions can be internally formed in a later step. With the silicon oxide film 15 and the silicon nitride film 16 used as masks, the Si active layer 13 is etched by 30 nm or so. Through the processes up to this step, a convex upper structure 13*a* is formed on the Si active layer 13.

Figure 5A:
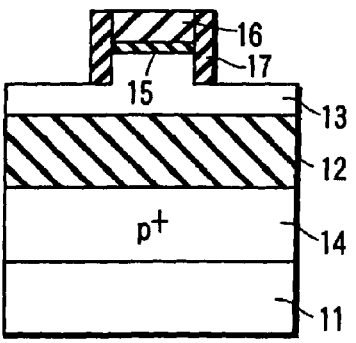
FIGS. 5A and 5B are cross-sectional views showing a step of manufacturing the semiconductor device according to the second embodiment.
Figure 5B:
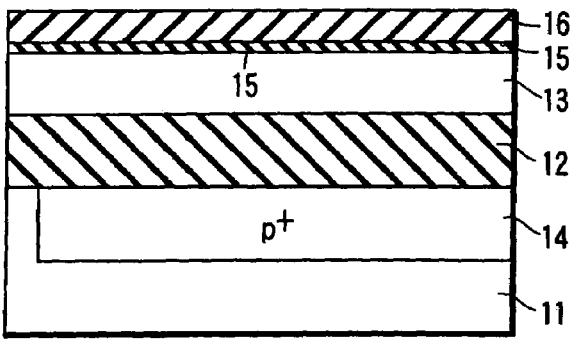

Subsequently, as shown in FIGS. 5A and 5B, a silicon nitride film is deposited on the entire surface. Anisotropic etching such as RIE or the like is then carried out, to form a sidewall insulating film 17 on the sidewalls of the upper structure.

Figure 6A:
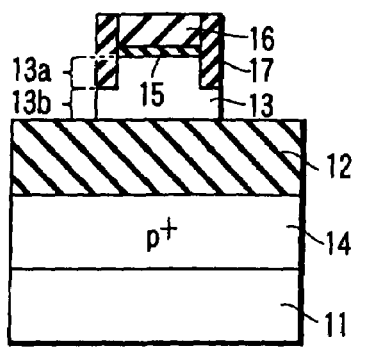
FIGS. 6A and 6B are cross-sectional views showing a step of manufacturing the semiconductor device according to the second embodiment.
Figure 6B:
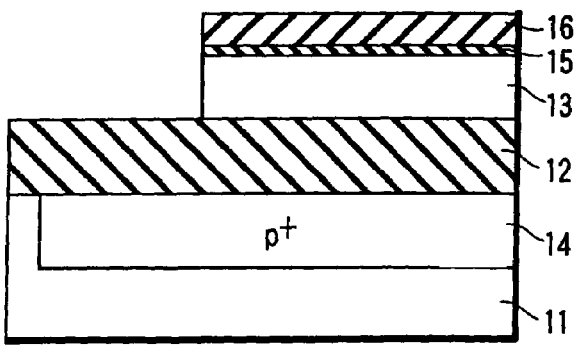

As shown in FIGS. 6A and 6B, with the sidewall insulating film 17 and the silicon nitride film 16 used as masks, anisotropic etching is carried out on the lower structure of the Si active layer 13, to expose the buried oxide film 12, forming a shallow trench having a depth of about 50 nm. Through the processes up to this step, the Si active layer 13 is processed into an island-like shape. The island-like Si active layer 13 is processed into a lower structure 13*b* and an upper structure 13*a*. The upper structure 13*a* is formed on the lower structure 13*b*, and has a smaller cross-section parallel to the main surface of the Si support substrate 11.

Subsequently, as shown in FIGS. 7A and 7B, a silicon oxide film is deposited. The surface of the silicon oxide film is flattened by CMP, to form an isolating insulating film 18 around the Si active layer 13 and the sidewall; insulating film 17.

Next, as shown in FIGS. 8A and 8B, the silicon nitride film 16 and the silicon oxide film 15 remaining on the Si active layer 13 are removed. Thereafter, the surface of the Si active layer 13 is oxidized to form a thermally-oxidized film 19 having thickness of about 5 nm.

Subsequently, as shown in FIGS. 9A and 9B, polysilicon is deposited on the thermally-oxidized film 19, to a thickness of about 10 nm. The polysilicon is then subjected to patterning, to form a dummy gate 20 in a region where a gate electrode should be formed later. With the dummy gate 20 used as a mask, n-type impurities are ion-implanted, to form a source/drain diffusion layer 21. In an example of ion-implantation, the n-type impurities are As, the acceleration voltage is 45 keV, and the dose amount is $3 \times 10^{15}$ cm$^{-2}$. After the ion-implantation, annealing is carried out at a temperature of 1,000° C. or lower, to activate the source/drain diffusion layer.

Figure 10A:
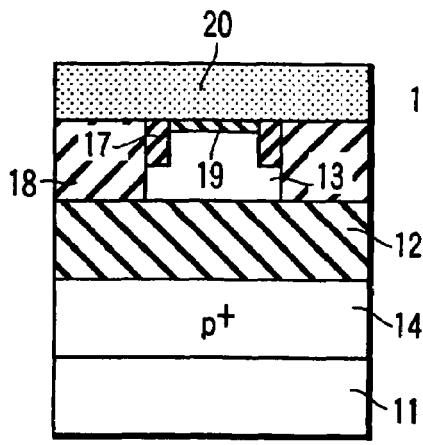
FIGS. 10A and 10B are cross-sectional views showing a step of manufacturing the semiconductor device according to the second embodiment.
Figure 10B:
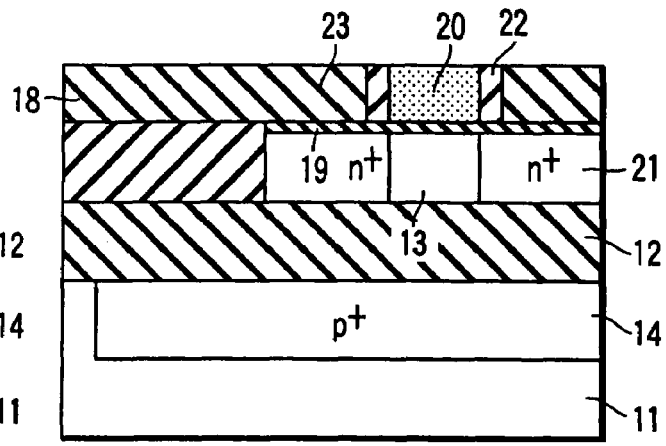

Subsequently, as shown in FIGS. 10A and 10B, a silicon nitride film is deposited. Anisotropic etching is then carried out to form a spacer 22 having thickness of about 30 nm on each side surface of the dummy gate 20. A TEOS—SiO$_2$ film 23 is deposited to a thickness of about 150 nm on the whole surface. Thereafter, the surface of the TEOS—SiO$_2$ film 23 is flattened by CMP, to expose the tops of the dummy gate 20 and the spacer 22.

Figure 11A:
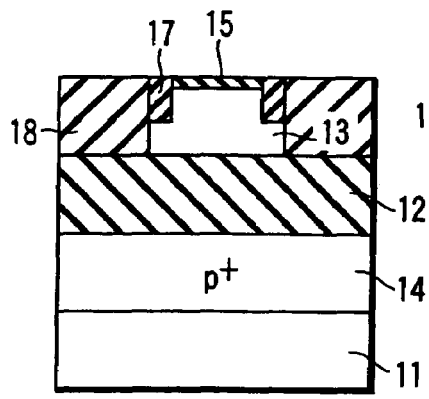
FIGS. 11A and 11B are cross-sectional views showing a step of manufacturing the semiconductor device according to the second embodiment.
Figure 11B:
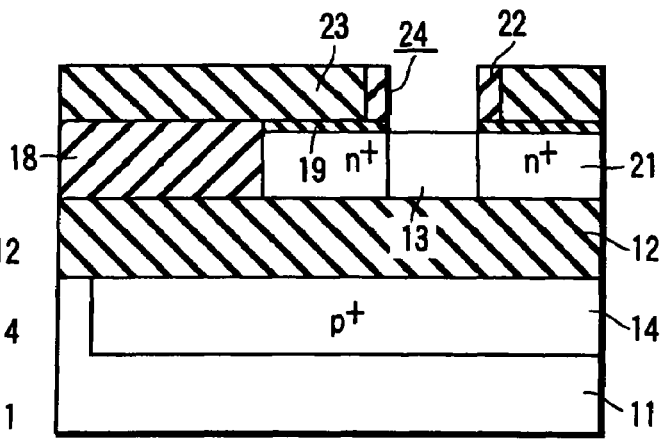

Next, as shown in FIGS. 11A and 11B, the dummy gate 20 is removed by CDE, wet etching, or the like, to form a gate groove 24 in a region where a gate should be formed. The thermally-oxidized film 19 exposed from the bottom of the gate groove 24 is removed by HF-based wet etching, to expose the Si active layer (upper structure) 13 from the bottom of the gate groove 24.

An actual gate insulating film will now be formed. Now that the source/drain region has been formed, no heat treatment over 600° C. will take place later. Accordingly, the gate insulating film need not be limited to an SiO$_2$ film, and may be made of a high-dielectric film or ferroelectric film, such as an HfO$_2$ film, ZrO$_2$ film, Ta$_2$O$_5$ film, TiO$_2$ film, (Ba, Sr)TiO$_3$ film, or the like. In addition, metal material may be used for the gate electrode. If a high-dielectric film or ferroelectric film is used for the gate insulating film, it is necessary to select gate electrode material in correspondence with a used gate insulating film. It is possible to use Al, W, Ru, Mo, TiN, TaN, WN, Nb, or the like.

The present embodiment shows an example using a ZrO$_2$ film as a High-k gate insulating film and Al/TiN as a gate electrode.

Figure 12A:
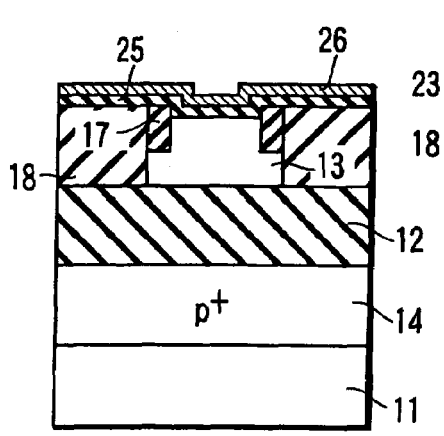
FIGS. 12A and 12B are cross-sectional views showing a step of manufacturing the semiconductor device according to the second embodiment.
Figure 12B:
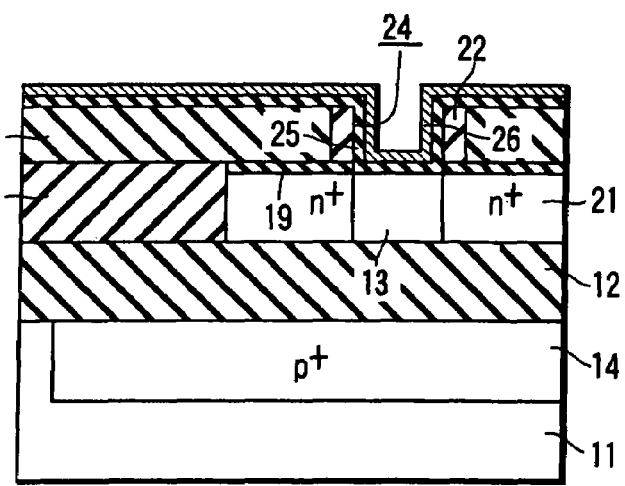

Next, as shown in FIGS. 12A and 12B, the surface of the Si active layer 13 exposed from a bottom of the gate groove 24 is nitrided to form a thin nitride film (not shown). Then, a ZrO$_2$ film 25 having an actual film thickness of about 3 nm is deposited. Further, a TiN film 26 having film thickness of about 5 nm is formed as a metal gate electrode in the first layer, by a CVD method.

Figure 13A:
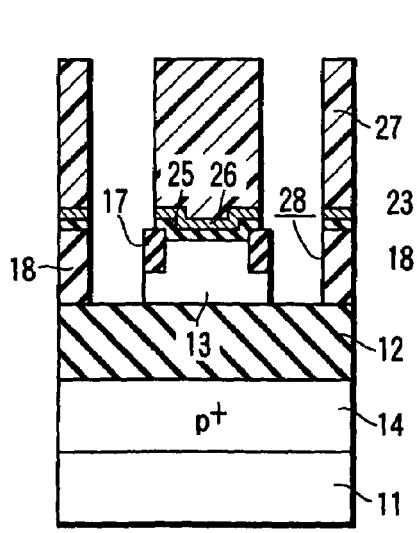
FIGS. 13A and 13B are cross-sectional views showing a step of manufacturing the semiconductor device according to the second embodiment.
Figure 13B:
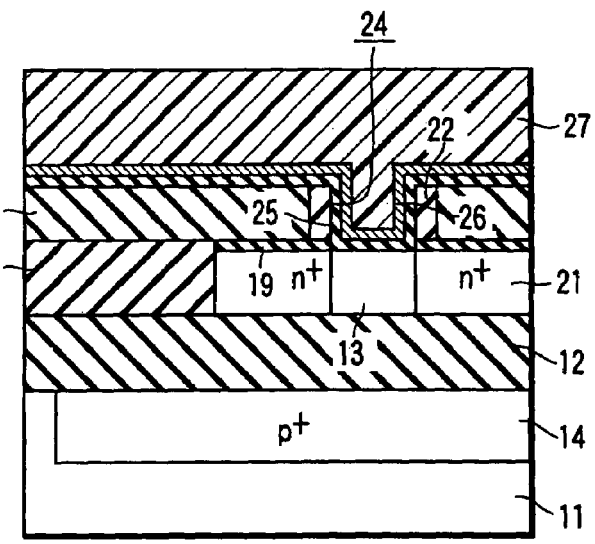

Subsequently, as shown in FIGS. 13A and 13B, a resist 27 is formed on the TiN film 26. With the resist 27 used as a mask, RIE is carried out on the condition that SiO$_2$ be selectively etched. Contact holes 28 are thus formed. The gate electrode will be buried in the contact holes 28 later, so that the gate electrode and the Si active layer (lower structure) 13 will be connected electrically.

In the etching, the sidewall insulating film 17 made of a silicon nitride film on each sidewall of the Si active layer 13 serves as an etching stopper, so that edges of the surface of the Si active layer 13 are not exposed. In addition, patterning of the resist need not be carried out immediately above the gate insulating film because resist is processed after forming the TiN film 26. As a result, reliability of the gate insulating film does not deteriorate. Two contact holes 28 are formed respectively on both side surfaces of the Si active layer on the ground as follows. Even if the resistance of the silicon body is more or less high, the electric potential applied to the gate electrode is transferred to corners of the Si active layer 13.

Figure 14A:
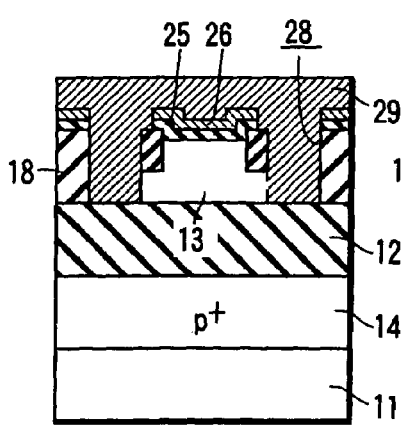
FIGS. 14A and 14B are cross-sectional views showing a step of manufacturing the semiconductor device according to the second embodiment.
Figure 14B:
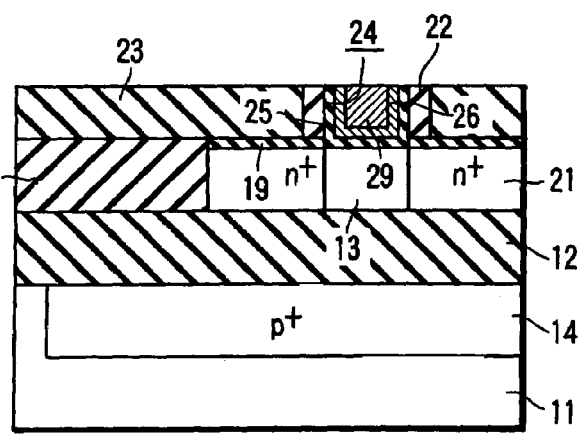

As shown in FIGS. 14A and 14B, the resist 27 is removed, and an Al film 29 is deposited with a thickness of about 300 nm, filling the gate groove 24 and the contact holes 28. Thereafter, the surface of the Al film 29 is flattened by CMP, and the TiN film 26 and the $ZrO_2$ film 25 are flattened sequentially. Through the processes up to this step, a metal gate electrode is formed in the gate groove 24, with a layered structure in which the TiN film 26 and the Al film 29 are stacked.

Figure 15A:
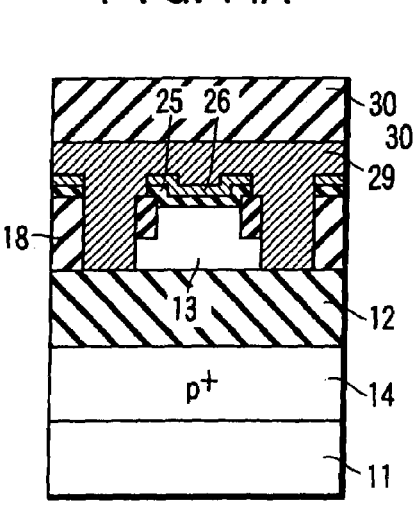
FIGS. 15A and 15B are cross-sectional views showing a step of manufacturing the semiconductor device according to the second embodiment.
Figure 15B:
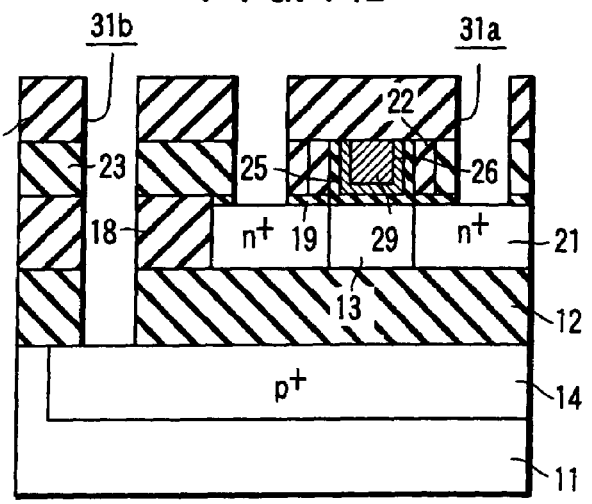

Subsequently, as shown in FIGS. 15A and 15B, a TEOS—$SiO_2$ film 23 is deposited on the entire surface by a CVD method, to form an interlayer insulating film 30. Further, the interlayer insulating film 30, the TEOS—$SiO_2$ film 23, and the thermally-oxidized film 19 are subjected to patterning, to form contact holes 31a connected to the source/drain diffusion layer 21, and a contact hole (not shown) connected to the gate electrode. Also, the interlayer insulating film 30, TEOS—$SiO_2$ film 23, isolating insulating film 18, and buried oxide film 12 are subjected to patterning, to form a contact hole 31b connected to the $p^+$-diffusion layer 14. The contact holes 31a and 31b may be formed simultaneously or separately.

Next, as shown in FIGS. 16A and 16B, wiring material such as an Al film is deposited. Patterning is then carried out to form an upper metal wire 32 connected to the source/drain diffusion layer 21 and an upper metal wire 33 connected to the $p^+$-diffusion layer 14. Simultaneously, an upper metal wire (not shown) connected to the Al film 29 is formed.

Through the steps described above, the semiconductor device according to the present embodiment is completed.

The semiconductor device according to the present embodiment provides the following advantages.

(1) A channel structure equivalent to an ideal δ doping channel (stepped channel profile) can be, electrically formed, so that the performance of the DTMOSFET (including a drive current and substrate bias coefficient) can be improved. This means that the performance of the DTMOSFET can be exhibited to the maximum.

(2) FIGS. 17A and 17B show a state where the $p^+$-diffusion layer 14 is applied with a voltage. As shown in FIGS. 17A and 17B, by applying a voltage to the $p^+$-diffusion layer 14 positive holes 40 having a high concentration are induced at the bottom of the Si active layer 13 contacting the buried oxide film 12. It is therefore possible to reduce the contact resistance even if an impurity diffusion layer having a high concentration is not formed at a portion connecting the Si active layer 13 and the gate electrode.

THIRD EMBODIMENT

Figure 18:
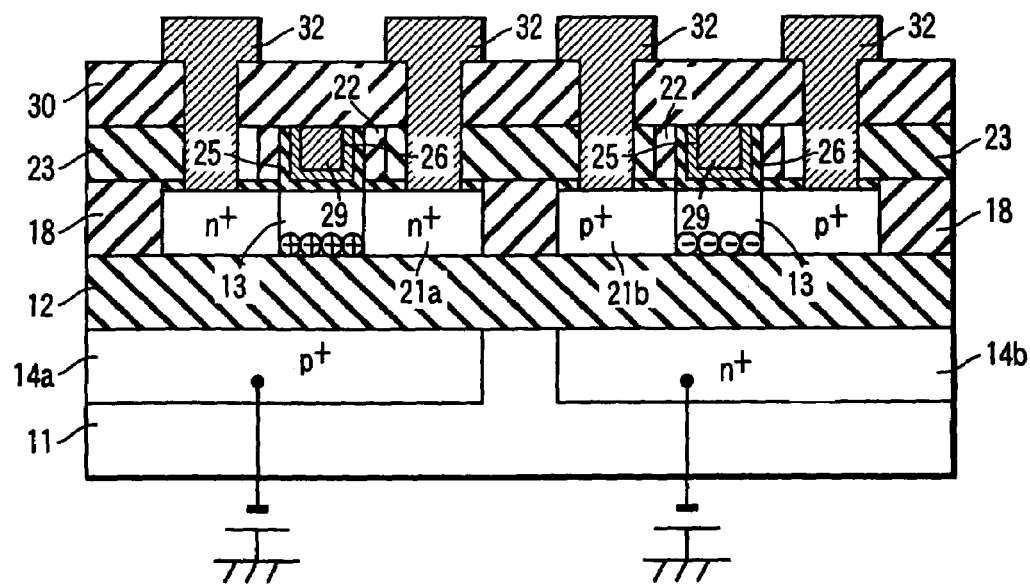
FIG. 18 is a cross-sectional view showing the structure of the semiconductor device according to the third embodiment.

FIG. 18 is a cross-sectional view showing the structure of a semiconductor device according to the third embodiment of the present invention. In the third embodiment, a CMOSFET is formed. The method of manufacturing the device is the same as that of the second embodiment and will therefore be omitted. The EIB of an nMOSFET in which a p-type body 13a and an $n^+$-type source/drain region 21a are formed is a positive hole. The EIB of a pMOSFET in which an n-type body 13b and a $p^+$-type source/drain region 21b are formed is electron. Metal gate electrodes 29 and the bodies 13a and 13b are electrically connected to each other by lower side surfaces of the Si active layers 13. Because of the metal gates, contacts of low-resistance can be made to active layers of both the n-type and the p-type. In a polysilicon gate, there is a problem that the active layer which can be contacted at a low resistance is limited to only one of the conductivity types, depending on whether the dopant is $n^+$ or $p^+$.

The conductivity types of the channel SOI are the p-type (nMOSFET) and n-type (pMOSFET) in operation in an inversion mode. In operation in accumulation mode, the conductivity types are the n-type (nMOSFET) and p-type (pMOSFET). The operations in the inversion mode and the accumulation mode will be referred to by way of reference publication: Makoto Takamiya and Toshiro Hiramoto, "High performance electrically induced body dynamic threshold SOI MOSFET (EIB-DTMOS) with large body effect and low threshold voltage," IEDM Tech. Dig. (1998), pp. 423-426.

According to the present embodiment, the same merits as those of the semiconductor devices described in the first and second embodiments can be attained with respect to both the nMOSFET and pMOSFET.

FOURTH EMBODIMENT

Figures 19A, 19B:
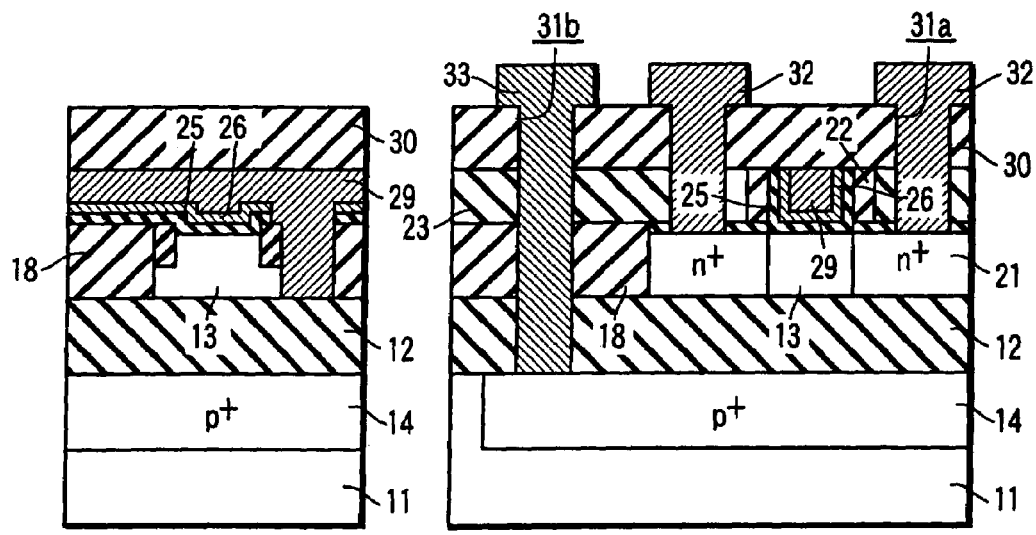
FIGS. 19A and 19B are cross-sectional views showing the structure of the semiconductor device according to the fourth embodiment.

FIGS. 19A and 19B are cross-sectional views showing the structure of a semiconductor device according to the fourth embodiment of the present invention. In the present embodiment, only one contact which connects the gate electrode 29 to the body 13 is formed. The method of manufacturing the semiconductor device is the same as that of the second embodiment and will therefore be omitted. The same merits as those of the first and second embodiments are attained, and further, the layout area can be reduced by thus adopting only one contact because the number of contacts is reduced.

FIFTH EMBODIMENT

Figure 20A:
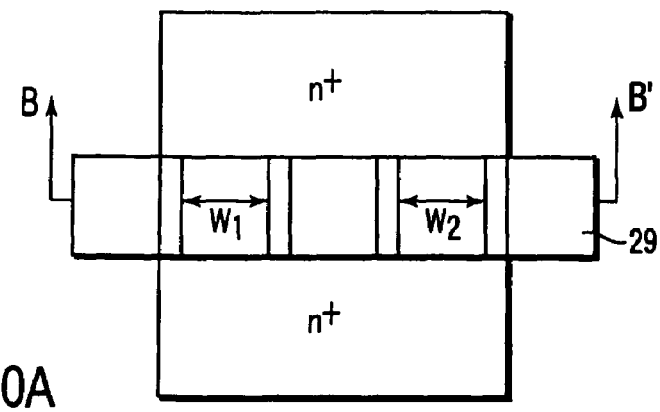
FIGS. 20A and 20B are cross-sectional views showing the structure of the semiconductor device according to the fifth embodiment.
Figure 20B:
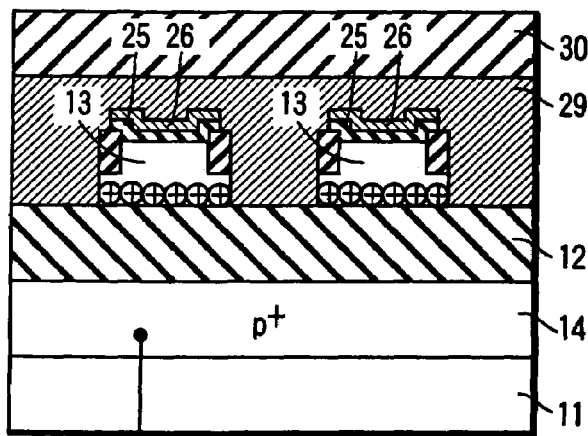

FIGS. 20A and 20B are views showing the structure of a semiconductor device according to the fifth embodiment of the present invention. FIG. 20A is a plan view of the semiconductor device, and FIG. 20B is a cross-sectional view cut along B-B' in FIG. 20A. As shown in FIGS. 20A and 20B, two island-like Si active layers 13a and 13b are formed on a buried oxide film. A sidewall insulating film 17, $ZrO_2$ film 25, and TiN film 26 are formed on each of the two Si active layers 13a and 13b.

Further, a gate electrode 29 is formed covering the sidewall insulating film 17 and TiN film 26 formed on each of the two Si active layers 13a and 13b and also covering the side surfaces of the Si active layers 13. In the semiconductor device according to the present embodiment, the channel of the transistor is divided into two channels, forming two parallel sub-transistors, which are combined to form one transistor. As shown in FIG. 20A, the transistor has a gate width W=W1+W2.

In the structure of the present embodiment, the same advantages as those of the first embodiment are attained. In addition, each gate width can be small, so that the gate potential is transmitted sufficiently to the body (i.e., the resistance of the body does not adversely affect the operation speed). The one transistor may be, of course, constituted by two or more sub-transistors.

SIXTH EMBODIMENT

Figure 21:
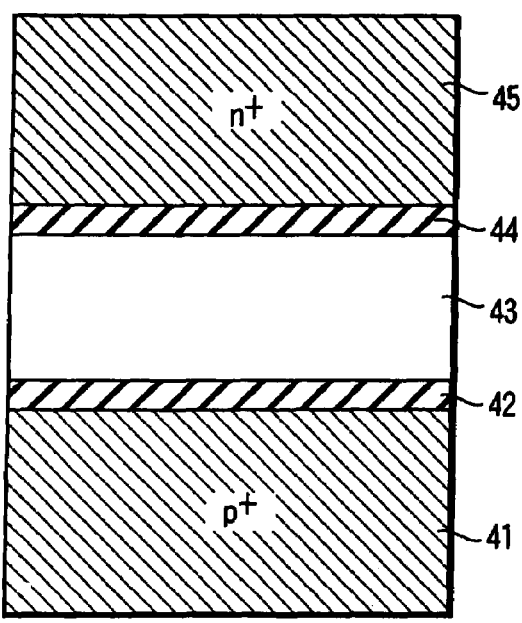
FIG. 21 is a view showing a basic structure of a semiconductor device according to the sixth embodiment.

The present embodiment considers replacement of a depletion layer with an insulating film. FIG. 21 is a view showing a basic structure of a semiconductor device according to the sixth embodiment of the present invention. As shown in FIG. 21, the part of a well of a conventional DTMOSFET is replaced with a back gate electrode 41, and a depletion layer (δ-doping layer) thereof is replaced with a back gate insulating film 42 and a silicon channel layer 43. Thus, a front gate electrode 45 formed on a front gate insulating film 44 is made of an $n^+$-type poly-Si film, and the back gate electrode 41 is made of a $p^+$-type poly-Si film. This double gate structure in which work functions of the front gate electrode 45 and the back gate electrode 41 are changed operates in the same manner as the conventional DTMOSFET. A detailed description of the operation will be found in a reference: Stephen Tang, "Dynamic Threshold MOSFETs for Future Integrated Circuits", Doctoral thesis at University of California, Berkeley, (2001), (see http://www-device.eecs.berkeley.edu/~stang/thesis.pdf).

If the depletion layer is thus replaced with the back gate insulating film 42, the back gate insulating film can be easily thinned so that the substrate bias effect γ can be maximized.

Figure 22A:
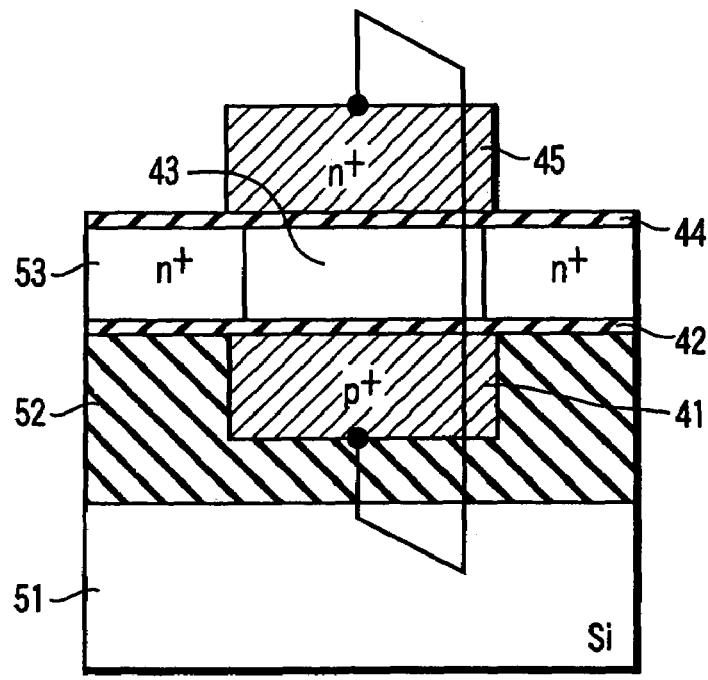
FIGS. 22A and 22B are cross-sectional views showing the structure of the semiconductor device according to the sixth embodiment.
Figure 22B:
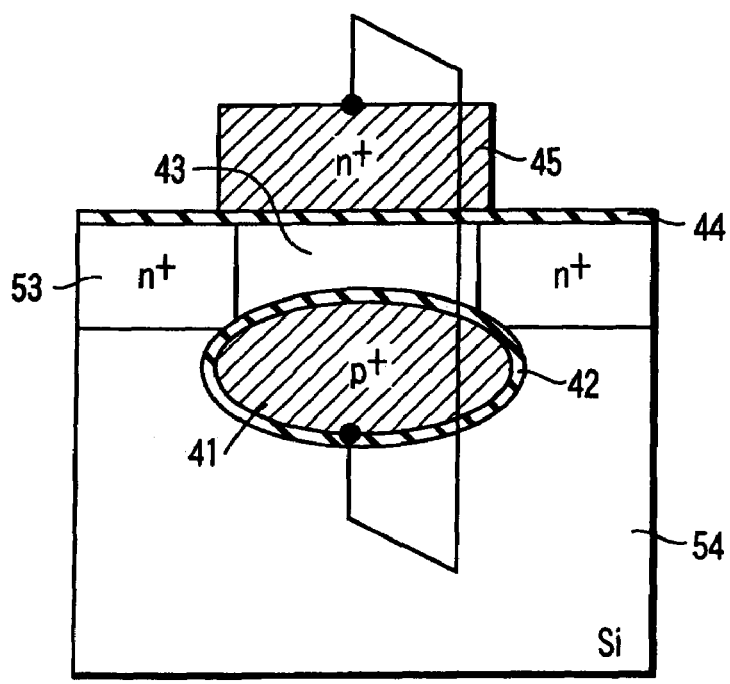
Figure 26D:
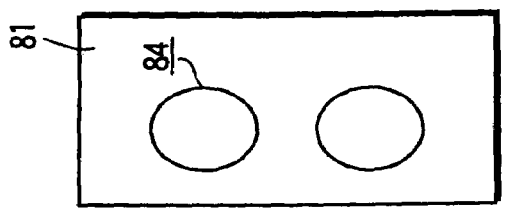
FIGS. 26A to 26D are views showing a step of manufacturing the two-input NAND circuit using the DTCMOSFET according to the seventh embodiment.
Figure 26A:
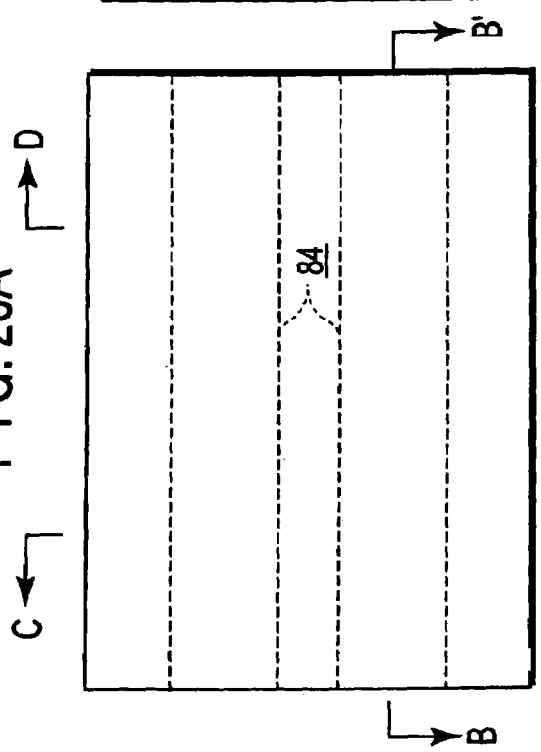
Figure 26B:
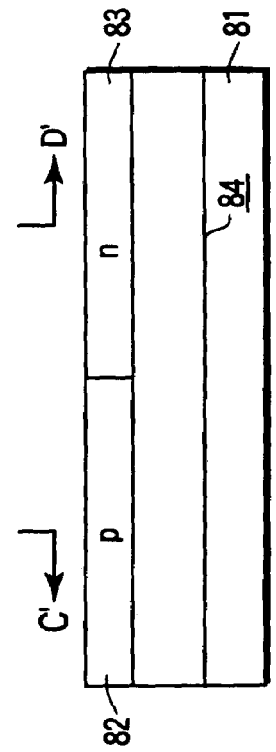
Figure 26C:
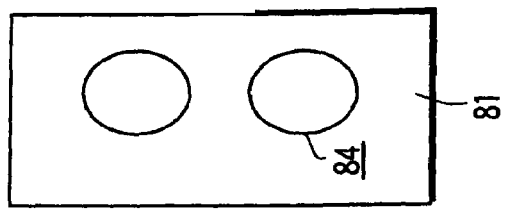

Adopting this structure, a DTMOSFET (which may be called a double gate transistor) is formed as shown in FIGS. 22A and 22B. FIGS. 22A and 22B are cross-sectional views showing the structure of the semiconductor device according to the sixth embodiment of the present invention. In FIGS. 22A and 22B, the reference numeral 51 denotes an Si support substrate, 52 a buried insulating film, 53 a source/drain region, as well as 54 a silicon substrate. The DTMOSFET shown in FIG. 22A is formed using an SOI substrate. The DTMOSFET shown in FIG. 22B uses a bulk silicon substrate 54. In the DTMOSFET shown in FIG. 22B, the back gate electrode 41 and back gate insulating film 42 are formed in a cavity formed in the silicon substrate 54.

As a result of adopting the structure described in the present embodiment, it is possible to realize an ideal DTMOSFET having the following merits.

(1) A channel structure equivalent to an ideal δ doping channel (stepped channel profile) can be formed, so the substrate bias coefficient γ can be increased to be large. As a result, the threshold voltage can be further reduced.

That is, the effect of improving the performance of the DTMOSFET can be exhibited to the maximum.

(2) A back gate insulating film isolates and separates the back gate electrode and source/drain region. It is therefore possible to form a DTMOSFET which does not cause leakage from forward junctions. Accordingly, the DTMOSFET can be used even when the power source voltage Vdd is 0.7 V or higher.

SEVENTH EMBODIMENT

In the present embodiment, description will be made of a two-input NAND circuit using a DTMOSFET having the structure described in the sixth embodiment.

FIG. 23 is a circuit diagram showing the configuration of a CMOS inverter using a DTMOSFET. As a characterizing feature of the DTMOSFET, the gate and well are electrically connected to each other. Therefore, the n-well and p-well in the inverter are electrically short-circuited to each other through the gate (in more general cases, wells of plural DTMOSFETs sharing a common gate wire are short-circuited to each other.) Between such wells, there is no need to form an insulating film for isolation.

FIGS. 24 and 25 are respectively a circuit diagram and a truth-value table which show the structure of a two-input NAND frequently used in logic circuits.

FIGS. 26A to 26D to FIGS. 40A to 40D illustrate a method of manufacturing a semiconductor device according to the seventh embodiment of the present invention, exemplifying the above-mentioned two-input NAND circuit.

FIGS. 26A to 26D to FIGS. 40A to 40D are views showing processing steps of the method of manufacturing the two-input NAND circuit using the DTCMOSFET according to the seventh embodiment. Among FIGS. 26A to 26D to FIGS. 40A to 40D, FIGS. 26A to 40A are plan views. FIGS. 26B to 40B are cross-sectional views along B-B', FIGS. 26C to 40C are cross-sectional views along C-C', and FIGS. 26D to 40D are cross-sectional views along D-D'.

Description will now be made in the order of processing steps. At first, as shown in FIGS. 26A to 26D, a p-type well 82 and an n-type well 83 are formed on the surface of a silicon substrate 81. Cavities 84 are formed in the silicon substrate 81, under a region where a gate should be formed, using an ESS technique (reference publication: T. Sato et al., "ESS," IEDM Tech. Dig., pp. 000-000, 1999). A method of forming the cavities will be explained in brief. A layer of an oxidized film is formed on the silicon substrate 81 by a thermal oxidation method and a CVD method. Patterning is thereafter carried out. Using the patterned oxide film as a mask, the silicon substrate is etched by a known RIE method. Thereafter, the oxidized film is peeled, and a heat treatment is carried out in a reducing atmosphere of, for example, hydrogen or the like, to form the cavities 84 in the silicon substrate 81.

Subsequently, as shown in FIGS. 27A to 27D, a silicon oxide film 85 having thickness of about 5 nm and a silicon nitride film 86 having thickness of about 100 nm are formed on the silicon substrate 81. The silicon oxide film 85 and the silicon nitride film 86 are subjected to patterning. Then, grooves having depth of about 200 nm are formed in the silicon substrate 81, using the patterned silicon nitride film 86 as a mask. A silicon oxide film is buried in these grooves, forming isolating portions (STI) 87. The grooves are formed to allow the cavities 84 to penetrate and the bottom of each groove is deeper than the bottom of each cavity 84. By forming the grooves in this manner, each cavity 84 is separated into cavities 84a and 84b.

Although the cavities 84 are exposed from the side surfaces of the grooves, material to be buried in the grooves can be prevented from being buried into the cavities 84, by optimizing conditions for depositing the material.

Subsequently, as shown in FIGS. 28A to 28D, a silicon nitride film 88 having selectivity in etching is formed on the entire surface of the silicon oxide film. Next, openings, each of which reaches a cavity 84a and a part of an isolating portion 87, are formed in the silicon nitride film 88. Further, with the silicon nitride film 88 used as a mask, the isolating portions 87 are removed by RIE, to form holes 89 connected to the cavities 84.

Subsequently, as shown in FIGS. 29A to 29D, a thermally-oxidized film 90 having a thickness of about 4 nm is formed on the surfaces of the p-type well 82 and silicon substrate 81, which are exposed from the surfaces of the cavities 84a and holes 89. Next, as shown in FIGS. 30A to 30D, a $p^+$-type poly-Si film 91 is deposited so as to fill the cavities 84 and holes 89. Thereafter, the surface of the $p^+$-type poly-Si film. 91 is flattened by a CMP method. The silicon nitride film 88 serves as a CMP stopper. This $p^+$-type poly-Si film 91 becomes a back gate in the side of the nMOSFET. Material is selected so that the work function of a back gate electrode in the side of the nMOSFET is larger than the work function of material of a front gate electrode which will be formed later.

Next, as shown in FIGS. 31A to 31D, openings, each of which reaches a cavity 84b and a part of an isolating portion 87 in the side of the pMOSFET, are formed in the silicon nitride film 88. At this time, the openings may be misaligned more or less, overlapping the p+-type poly-Si film 91. Further, the isolating portions 87 are removed by RIE, using the silicon nitride film 88 as a mask. Holes 92 connected to the cavities 84b are thus formed.

Subsequently, as shown in FIGS. 32A to 32D, a thermally-oxidized film 93 having a thickness of about 4 nm is formed, like the side of the nMOSFET. Then, an n+-type poly-Si film 94 is formed. This n+-type poly-Si film 94 becomes a back gate in the side of the pMOSFET. Material is selected so that the work function of a back gate electrode in the pMOSFET is smaller than the work function of the material of a front gate electrode which will be formed later.

Note that the film thickness of each of the thermally-oxidized films (back gate insulating films) 90 and 93 is preferably three times larger the film thickness of a gate insulating film (front gate insulating film) which will be formed later on the well. The reason is described in the reference: Stephen Tang, "Dynamic Threshold MOSFETs for Future Integrated. Circuits", Doctoral thesis at University of California, Berkeley, (2001), (see http://www-device.eecs.berkeley.edu/~stang/thesis.pdf).

Next, as shown in FIGS. 33A to 33D, the p+-type poly-Si film 91, n+-type poly-Si film 94, silicon nitride film 88, and silicon oxide films 85 and 87 are removed, as these films are unnecessary. Next, a new silicon oxide film 95 having a film thickness of about 4 nm is formed on the surfaces of the p-type well 82, n-type well 83, p+-type poly-Si film 91, and n+-type poly-Si film 94.

Subsequently, as shown in FIGS. 34A to 34D, a silicon nitride film 96 having film thickness of about 100 nm is deposited on the surfaces by an LPCVD method. To form dummy gates which will be removed later, the silicon nitride film 96 is patterned and is left selectively remaining in regions where gates should be formed. Note that the silicon nitride film 96 will be used as a mask in ion-implantation and as a CMP stopper or the like in later steps.

Next, the surface in the side of the pMOSFET is covered with a resist. Then, n-type impurities are ion-implanted in the side of the nMOSFET, to form an n+ source/drain diffusion layer 97. The resist is removed and the surface in the side of the nMOSFET is covered with a resist. P-type impurities are ion-implanted in the side of the pMOSFET, to form a p+ source/drain diffusion layer 98. At this time, the source/drain diffusion layers 97 and 98 are formed to contact the oxide films 90 and 93.

If necessary, an extension structure may be formed. In case of an extension structure, after ion-implantation for extension, a sidewall consist in a silicon oxide film is formed on each side surface of the silicon nitride film 96. The film thickness of the silicon oxide film to form the sidewalls is about 30 nm. An n− diffusion layer for the extension is ion-implanted on the conditions that ion seed is As, an acceleration voltage is 15 keV, and a dose amount is about $3\times10^{14}$ cm$^{-2}$. In addition, the n+ source/drain diffusion layer is ion-implanted, for example, on the conditions that ion seed is As, an acceleration voltage is 45 keV, and a dose amount is $3\times10^{15}$ cm$^{-2}$. After completion of all ion-implantations, annealing at a temperature up to 1,000° C. is carried out to activate the source/drain diffusion layers 97 and 98.

Subsequently, as shown in FIGS. 35A to 35D, a TEOS—SiO$_2$ film 99 is deposited on the entire surface . . . . Then, the surface of the TEOS—SiO$_2$ film 99 is flattened by CMP (Chemical Mechanical Polishing), to expose the top of the silicon nitride film 96.

Next, as shown in FIGS. 36A to 36D, the silicon nitride film 96 is removed by wet etching or the like, to form gate grooves 100 where gates should be formed. The silicon oxide film 95 under the dummy gates are removed by HF-based wet etching.

An actual gate insulating film will now be formed. Now that the source/drain diffusion layers 97 and 98 have been formed, no heat treatment over 600° C. will take place later. Accordingly, the gate insulating film need not be limited to an SiO$_2$ film but may be made of a high-dielectric film or ferroelectric film such as an HfO$_2$ film, ZrO$_2$ film, Ta$_2$O$_5$ film, TiO$_2$ film, (Ba, Sr)TiO$_3$ film, or the like. In addition, a metal may be used for gate electrodes. If a high-dielectric film or ferroelectric film is used for the gate insulating film, it is necessary to select an appropriate gate electrode material. It is possible to use Al, W, Ru, Mo, Tin, TaN, WN, or the like.

Description will now be given of an example using a ZrO$_2$ film as a High-k gate insulating film, and an Al/TiN film as a gate electrode.

As shown in FIGS. 37A to 37D, the surface of the silicon substrate 81 is thinly nitrided, and then, a ZrO$_2$ film having an actual film thickness of 3 nm is deposited, to form a gate insulating film 101. Further, a TiN film 102 having a film thickness of about 5 nm is deposited and formed as a metal gate electrode in a first layer by a CVD method. The TiN film 102 serves as barrier metal which prevents metal material from diffusing into the substrate.

A resist (not shown) having openings at the interface between the p+-type poly-Si film 91 and the n+-type poly-Si film 94 is formed on the TiN film 102. As shown in FIGS. 38A to 38D, RIE is carried out with the resist used as a mask, to form contact holes 103. The contact holes 103 may be formed by etching only the TiN film 102 and ZrO$_2$ film 101. It is however preferred that parts of the p+-type poly-Si film 91 and the n+-type poly-Si film 94 only under the TiN film 102/ZrO$_2$ film 101 should be etched to some extent as seen from FIGS. 38A to 38D. In this manner, when a front gate is made contact the p+-type poly-Si film 91 and n+-type poly-Si film 94 later, the contact area therebetween increases so that the resistance is reduced. In addition, since the resist process is carried out after forming the TiN film 102, patterning of the resist need not be performed directly on the gate insulating film. As a result, the reliability of the gate insulating film can be improved.

After removing the resist, as shown in FIGS. 39A to 39D, an Al film 104 having a film thickness of about 300 nm is deposited, to form metal gates each having a layered structure consisting of the TiN film 102 and the Al film 104. CMP is performed on the surface, to flatten the surface of the Al film 104, and the Al film 104, TiN film 102, and ZrO$_2$ film 101 on the TEOS—SiO$_2$ film 99 are removed.

After forming the metal gates, the same process as a normal LSI manufacturing process is carried out. As shown in FIGS. 40A to 40D, a TEOS—SiO$_2$ film is deposited by a CVD method, to form an interlayer insulating film 105. Contact holes 106 are opened in the source/drain region and gate electrodes, and upper metal wires 107 containing Al as main material are formed.

As has been described above, according to the present embodiment, the following advantages are obtained.

(1) A channel structure equivalent to an ideal δ doping channel (stepped channel profile) can be formed electrically, so the substrate bias coefficient γ can be increased to be large. As a result, the threshold voltage can further be reduced.

That is, the effect of improving the performance of the DTMOSFET can be exhibited to the maximum.

(2) A back gate insulating film isolates and separates the back gate electrode and source/drain region. It is therefore possible to form a DTMOSFET which does not cause leakage from forward junctions. Accordingly, the DTMOSFET can be used even when the power source voltage Vdd is 0.7 V or higher.

(3) Since a silicon channel is isolated for every transistor, it is possible to realize a DTMOSFET structure in which no short-circuited current flows between channels (or wells) of two adjacent transistors. Even when two adjacent transistors share a source or drain, no short-circuited current flows between the channels (or wells). Since no extra isolating structure is required, the area of the LSI can be reduced.

(4) The silicon surface side (front gate side) is mainly used as a channel, and the back gate side (surfaces of silicon cavities) is not used as a channel. Interface levels of the back gate side need not be considered. That is, the back gate can be formed more easily. For example, there is no problem if the back gate is buried and formed in cavities having many interface levels.

(5) Since isolation between back gates of plural DTMOS-FETs sharing a common gate is not required, the circuit layout area can be reduced. In a conventional MOSFET, back gates are n- and p-wells, which must be insulated and isolated from each other. In the present embodiment, there is no problem although the $n^+$-poly-Si film and $p^+$-poly-Si film are short-circuited to each other.

EIGHTH EMBODIMENT

With reference to FIGS. 41A to 41D to 46A to 46D, description will be made of a method of manufacturing a semiconductor device according to the eighth embodiment of the present invention.

FIGS. 41A to 41D to 46A to 46D are views showing steps in a method of manufacturing a two-input NAND circuit using a DTCMOSFET according to the eighth embodiment. FIGS. 41A to 46A are plan views. FIGS. 41B to 46B are cross-sectional views along B-B', FIGS. 41C to 46C are cross-sectional views along C-C', and FIGS. 41D to 46D are cross-sectional views along D-D'.

At first, the structure shown in FIGS. 41A to 41D is formed. This structure is formed using the steps shown in FIGS. 26A to 26D to FIGS. 32A to 32D in the seventh embodiment.

Subsequently, as shown in FIGS. 42A to 42D, the silicon nitride film 86 and the silicon oxide film 85 are removed from the surface. Then, a gate insulating film 110 having a film thickness of about 1.5 nm is formed on the surface of Si substrate 81. The gate insulating film 110 is formed by depositing a high-dielectric film such as an $SiO_2$ film or $ZrO_2$ film.

Subsequently, as shown in FIGS. 43A to 43D, a Poly-Si film 111 having a film thickness of about 150 nm is deposited by an LPCVD method. To process the poly-Si film into shapes of gate electrodes, a resist pattern (not shown) is formed on the poly-Si film. The poly-Si film is etched (RIE) to form gate electrodes 111. A sidewall insulating film 112 made of a silicon nitride film and having a film thickness of about 40 nm is formed on each sidewall of the gate electrodes 111.

After removing the resist pattern, the surface in the side of the pMOSFET is covered with a resist. Then, n-type impurities are ion-implanted into the side of the nMOSFET, to form an $n^+$-source/drain diffusion layer 97. The resist is removed, and the surface in the side of the nMOSFET is covered with the resist. In the side of the PMOSFET, p-type impurities are ion-implanted to form a $p^+$-source/drain diffusion layer 98. At this time, the source/drain diffusion layer is formed so as to contact the oxide films 90 and 93.

If necessary, an extension structure may be formed. If so, after ion-implantation for extension, a sidewall insulating film 112 made of a silicon oxide film is formed on each side surface of the silicon nitride film 96. The film thickness of the silicon oxide film to form the sidewall insulating film 112 is about 30 nm. An $n^-$ diffusion layer for the extension is ion-implanted on the conditions that ion seed is As, an acceleration voltage is 15 keV, and a dose amount is about $3 \times 10^{14}$ $cm^{-2}$. In addition, the $n^+$ source/drain diffusion layer is ion-implanted, for example, on the conditions that ion seed is As, an acceleration voltage is 45 keV, and a dose amount is $3 \times 10^{15}$ $cm^{-2}$. After completion of all the ion-implantations, annealing at a temperature up to 1,0000° C. is carried out to activate the source/drain diffusion layers.

A resist (not shown) having openings at the interface between the $p^+$-type poly-Si film 91 and the $n^+$-type poly-Si film 94 is formed on the TiN film 102. As shown in FIGS. 44A to 44D, RIE is performed on the gate electrodes 111 and gate insulating film 110, with the resist used as a mask, thereby forming contact holes 113. The contact holes 113 may be formed by etching only the gate electrodes 111 and gate insulating film 110. It is however preferred that the $p^+$-type poly-Si film 91 and the $n^+$-type poly-Si film 94 only under the gate electrodes 111 and gate insulating film 110 should be etched to some extent. In this manner, when a front gate is made to contact the $p^+$-type poly-Si film 91 and $n^+$-type poly-Si film 94 later, the contact area therebetween increases so that the resistance is reduced.

In addition, since the resist process is carried out after forming the TiN film 102, patterning of the resist need not be performed directly on the gate insulating film 110. As a result, the reliability of the gate insulating film 110 can be improved.

After removing the resist, a Co film is deposited on the entire surface. Thereafter, the Co film is made reacted with Si by annealing, as shown in FIGS. 45A to 45D. Formed thus is a $CoSi_2$ film on the gate electrode 111 and the source/drain regions 97 and 98, and on the poly-Si films 91 and 94 at the portions of the contact holes 113 connecting the front gate electrode and the back gate electrode. As shown in FIGS. 45A to 45D, no sidewall insulating film 112 exists on the side surfaces of the gate electrodes 111 exposed from the side surfaces of the contact holes 113 connecting the front and back gate electrodes. Therefore, the $CoSi_2$ film 114 is formed also on the surfaces of the gate electrodes 111 exposed from the side surfaces of the contact holes 113. A bridging phenomenon hence occurs so that the gate electrodes 111 are electrically connected in the direction of A-A'. The gate electrodes 111 as front gates are electrically connected to the poly-Si films 91 and 94 as back gates by the $CoSi_2$ film 114.

After forming the metal gates, the same process as a normal LSI manufacturing process is carried out. As shown in FIGS. 46A to 46D, a TEOS—$SiO_2$ film is deposited by a CVD method, to form an interlayer insulating film 115. Contact holes 116 are opened in the source/drain regions and gate electrodes, and upper metal wires 117 containing Al as main material are formed.

As has been described above, according to the present embodiment, the same advantages as those of the seventh embodiment are obtained.

NINTH EMBODIMENT

FIG. 47 is a cross-sectional view showing the structure of a DT-nMOSFET according to the ninth embodiment. The method of manufacturing the DT-nMOSFET is the same as that of the seventh embodiment, and explanation thereof will be omitted.

In the present embodiment, doping concentrations of p$^+$-type poly-Si films 91a and 91b are changed to set respectively the fermi levels (work functions) of the p$^+$-type poly-Si films 91b and 91a to 4.9 eV and 4.7 eV. In this arrangement, transistors having different threshold voltages can be easily formed in one LSI. In case of the present embodiment, the DT-nMOSFET in the side of the p$^+$-type poly-Si film 91a has a higher threshold voltage than that in the side of the p$^+$-type poly-Si film 91b.

According to the present embodiment, the same merits as those of the seventh embodiment can be attained. Further, the work functions of the back gates are changed, so plural (two or more) transistors respectively having different threshold voltages can be formed in one single LSI. That is, it is possible to overcome a drawback (the difficulty in forming plural threshold voltages) of conventional perfectly-depleted devices (including a double-gate transistor in which work functions of front and back gates are equal to each other).

TENTH EMBODIMENT

FIGS. 48A to 48K are views showing steps in a method of manufacturing a semiconductor device according to the tenth embodiment of the present invention.

At first, a silicon oxide film 122 is formed on a silicon substrate 121 by a thermal oxidation method and a CVD method. Patterning is carried out on the silicon oxide film 122. Using the patterned oxide film 122 as a mask, the silicon substrate 121 is etched by a known RIE method to form grooves 123.

Thereafter, as shown in FIG. 48B, the silicon oxide film 122 is peeled. Then, cavities 124 are formed in the silicon substrate 121 by a heat treatment in a reducing atmosphere of, for example, hydrogen or the like. Details of the treatment are disclosed in Jpn. Pat. Appln. KOKAI Publication No. 2000-12858. Due to the treatment, the height of the surface of the silicon substrate 121 is reduced immediately above the cavities 124. The surface of the substrate 121, however, may be flattened according to a method disclosed in Jpn. Pat. Appln. KOKAI Publication No. 2001-144276. Thereafter, by a known well-forming method and a known isolating method, isolating regions 125 are formed on the silicon substrate 121, and an n-well 126a is formed in a PMOSFET region, as well as a p-well 126b in an nMOSFET region.

Subsequently, as shown in FIG. 48D, a dummy gate insulating film 127 is formed on the entire surface. Then, an undoped poly-silicon film 128 is deposited to a film thickness of 80 nm by a CVD method, to obtain dummy gate electrodes. Thereafter, as shown in FIG. 48E, the poly-silicon film 128 for forming dummy gates is processed into shapes of gate electrodes. Ion-implantations are performed respectively on the regions of the nMOSFET and pMOSFET, to dope the source/drain regions 129a and 129b. As is ion-implanted into the p-well 126b in the nMOSFET region, and B is ion-implanted into the n-well 126a in the pMOSFET region, to form the source/drain regions 129a and 129b. The ion-implantations are carried out on the conditions as follows. For As, an acceleration voltage is 30 keV and dose amount is $4 \times 10^{15}$ cm$^{-2}$. For B, an acceleration voltage is 3 keV and dose amount is $4 \times 10^{15}$ cm$^{-2}$.

Subsequently, as shown in FIG. 48F, a silicon oxide film 130 is deposited on the entire surface by a CVD method. Then, the silicon oxide film 130 is flattened by a known CMP method until tops of dummy gates 128 are exposed. In this state, an RTA treatment is carried out to activate ion-implanted impurities. The RTA treatment is performed, for example, in a nitrogen atmosphere at 1,000° C. for one second.

Figure 48G:
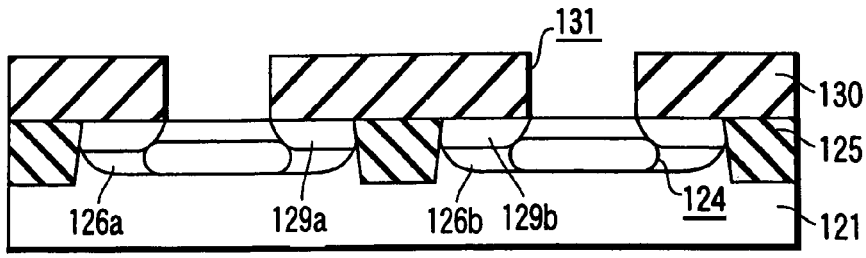

Next, as shown in FIG. 48G, only the dummy gates 128 are selectively etched from the oxide film 130. The selective etching of the dummy gates 128 adopts a CDE method, for example. Further, the dummy gate insulating film 127 is peeled by wet etching based on dilute hydrofluoric acid, to form gate grooves 131.

Figure 48H:
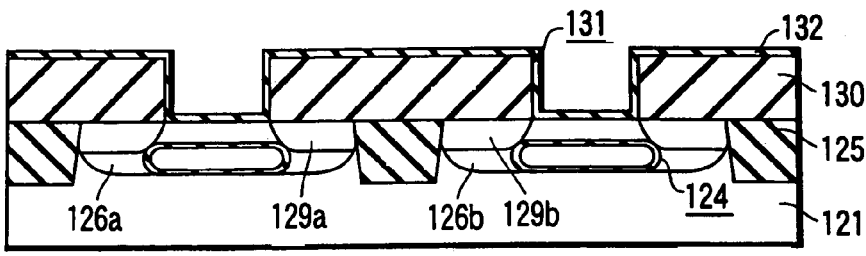

Subsequently, opening portions (not shown) which extend to the cavities 124 are formed in the bottoms of the gate grooves 131. Next, as shown in FIG. 48H, a gate insulating film 132 which covers the insides of the cavities 124 and the substrate surface is formed by a thermal oxidation method and by a CVD method forming a high-dielectric film made of, for example, tantalum oxide or the like.

Figure 48I:
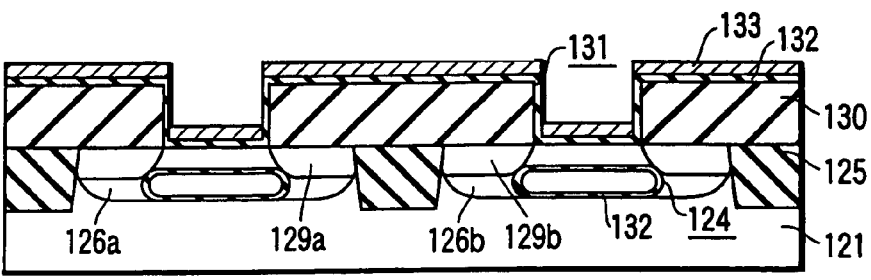

Subsequently, as shown in FIG. 48I, a Ta film 133 to form gate electrodes in the upper side of channels is deposited to a thickness of 200 nm by a sputtering method. Since the sputtering method is anisotropic, the Ta film is deposited only on the substrate surface, and is not formed inside the cavities 124.

Figure 48J:
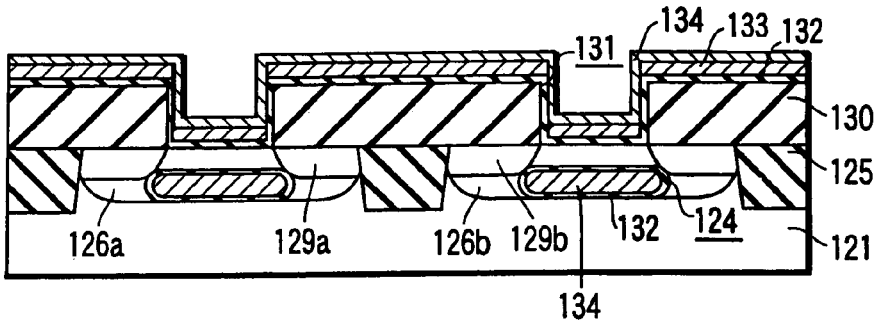

Next, as shown in FIG. 48J, an Al film 134 to form gate electrodes in the lower side of channels is deposited to a thickness of 200 nm by a CVD method. The Al film 134 is deposited on the inner walls of the cavities 124 via the openings formed previously. Formed in this method is a structure which includes gate electrodes made of different metals respectively in the upper and lower portions of channels.

Figure 48K:
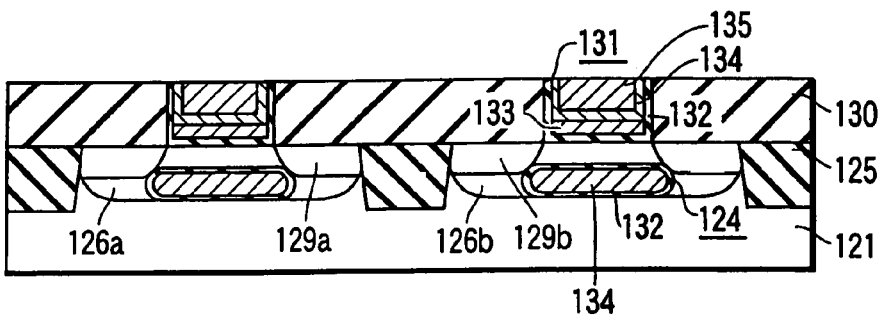

Subsequently, as shown in FIG. 48K, a tungsten film 135 is deposited by a CVD method until the opening portions extending to the cavities 124 and concave portions at upper portions of the gates are filled. Thereafter, the surface is flattened by a CMP method. Then, a wiring process is carried out to prepare a CMOSFET.

Figure 49:
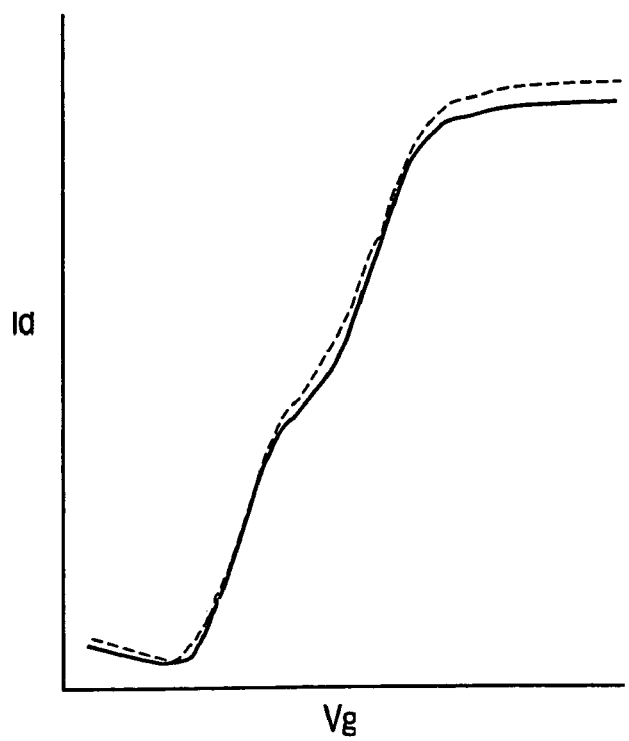
FIG. 49 is a characteristic graph showing the Ig-Vg characteristics of the semiconductor device prepared by the manufacturing steps shown in FIGS. 48A to 48K.

Ig-Vg characteristics of the CMOSFET prepared by the steps as described above are investigated, and the results are shown in FIG. 49. In FIG. 49, the continuous curve represents the Ig-Vg characteristics of the pMOSFET, and the broken curve those of the nMOSFET. As shown in FIG. 49, no large difference was found between the characteristics of the nMOSFET and pMOSFET, on the following grounds. In the nMOSFET, the transistor is turned ON firstly by the gate electrode in the surface side. In contrast, in the pMOSFET, the transistor is turned ON firstly by the gate electrode in the cavity side. It is considered that, as a result of this, substantially equal threshold voltages could be attained in any type of transistor. In the Ig-Vg characteristics shown in FIG. 49, steps are found at their risings because the side of the gate having a lower threshold value is firstly turned ON and the side of the gate having a higher threshold value is then turned ON, in each type of transistor.

Figure 50:
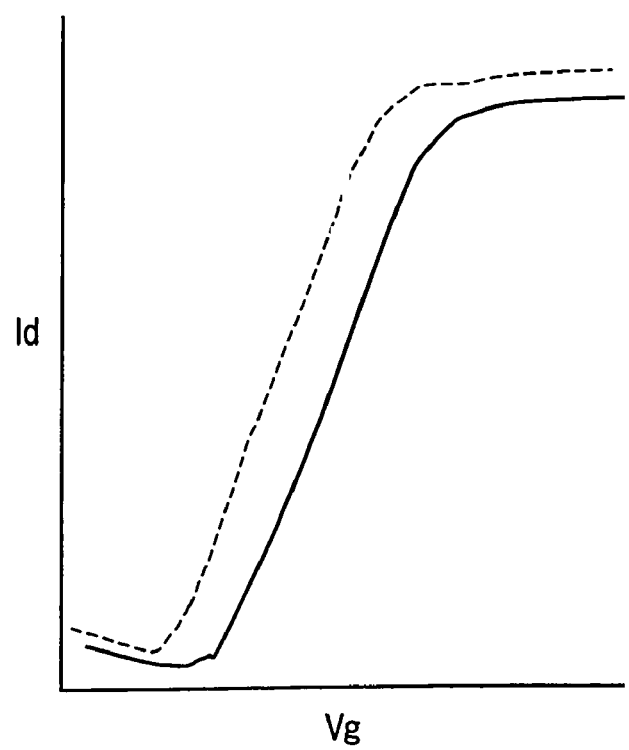
FIG. 50 is a characteristic graph showing the Ig-Vg characteristics of a semiconductor device prepared by conventional manufacturing steps.

For the purpose of comparison, transistors having a normal metal gate structure having no cavity structure is prepared by the steps shown in FIGS. 48A to 48K except for the steps of forming cavities. The Ig-Vg characteristics of the transistors are shown in FIG. 50. In FIG. 50, the continuous curve represents the Ig-Vg characteristics of the pMOSFET, and the broken curve those of the pMOSFET. As shown in FIG. 50, a difference of about 0.8 V is found between the threshold voltages of the nMOSFET and pMOSFET. This is because the gate electrodes are of only one type although the fermi levels are differ from each other by 0.8 V between the channel regions of the nMOSFET and pMOSFET.

In the embodiment described above, a tantalum oxide film is used as the gate insulating film. However, the gate insulating film may be of another insulating material, such as silicon oxide, silicon nitride, aluminum oxide, zirconium oxide, hafnium oxide, or the like. In addition, the gate electrodes are not limited to the two kinds of metal described above, as long as they have respectively different work functions. Guidelines for selecting metals or metal compounds are as follows. The work function of one kind of metal or metal compound is substantially 4.7 eV or more, and that of the other kind of metal or metal compound is 4.7 cV or less. Then, both the nMOSFET and pMOSFET can have low threshold voltages. In addition, the threshold voltages of both the nMOSFET and pMOSFET can be set to be substantially equal to each other, if the difference between the work functions of the two kinds of metal is set within a range of 0.5 eV to 1.0 V. The kinds of metal forming electrodes to be used are not limited to Al and Ta described in the present embodiment, and may be W, Ti, Mo, Cu, and the like. Alternatively, a metal compound such as TiN or metal silicide such as $TiSi_2$, $WSi_2$, or $MoSi_2$ may be used.

The preparation method thereof is not limited to the method described in the present embodiment. It is possible to adopt a method in which upper and lower gate electrodes are formed simultaneously and a different kind of metal is deposited only on the upper electrodes. Thus, it is possible to change the work function of only the upper gate electrodes. Alternatively, one kind of gate electrodes are formed in both the upper and lower sides. Then, only in one of the upper and lower sides, the gate electrodes are peeled. In the peeled side, gate electrodes may further be formed with use of a second kind of metal or metal compound.

The semiconductor device described in the present embodiment is an asymmetrical double gate MOSFET including a partially-depleted device, and therefore does not always operate as a DTMOSFET. However, the semiconductor device operates as a DTMOSFET if it has sufficiently small channel thickness, and operates in a perfectly-depleted manner and if its back-gate insulating film thickness and its channel thickness satisfy the conditions described in the reference: Stephen Tang, "Dynamic Threshold MOSFETs for Future Integrated Circuits", Doctor thesis at University of California, Berkeley (2001), (see http://www-device.eecs-.berkeley.edu/~stang/thesis:pdf).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device forming a MISFET, comprising:
   forming a cavity inside a semiconductor substrate;
   forming a hole in the semiconductor substrate, the hole being connected to the cavity;
   forming a back gate insulating film on surfaces of the semiconductor substrate which are exposed from the cavity and hole;
   forming a back gate electrode in the cavity and hole having surfaces covered with the back gate insulating film;
   forming a dummy gate in a region on the semiconductor substrate in which a gate electrode of the MISFET is to be formed;
   implanting impurities into portions of the semiconductor substrate which are not covered with the dummy gate, to form source and drain regions;
   forming an interlayer insulating film around the dummy gate;
   selectively removing the dummy gate, to form a gate groove having sidewalls made of the interlayer insulating film and exposing the semiconductor substrate and the back gate electrode;
   forming a front gate insulating film at a bottom surface of the gate groove;
   partially etching the front gate insulating film at the bottom surface of the gate groove, to form a contact hole connected to the back gate electrode; and
   forming a front gate electrode having a different work function from that of the back gate electrode in the gate groove and contact hole.

2. The method of manufacturing a semiconductor device, according to claim 1, wherein a barrier metal is formed on the gate insulating film, and the barrier metal and gate insulating film are partially etched to form the contact hole.

3. The method of manufacturing a semiconductor device, according to claim 1, wherein the cavity has a curved line that is opposed to a surface of the semiconductor substrate on which the front gate electrode is to be formed.

4. The method of manufacturing a semiconductor device, according to claim 1, wherein n-type impurities are implanted into the source and drain regions, and the work function of the front gate electrode is smaller than that of the back gate electrode.

5. The method of manufacturing a semiconductor device, according to claim 1, wherein p-type impurities are implanted into the source and drain regions, and the work function of the front gate electrode is larger than that of the back gate electrode.

6. The method of manufacturing a semiconductor device, according to claim 1, wherein a film thickness of the back gate insulating film is up to three times larger than a film thickness of the front gate insulating film.

7. The method of manufacturing a semiconductor device, according to claim 1, wherein the front gate electrode and back gate electrode are respectively made of different kinds of metal or metal compound.

8. A method of manufacturing a semiconductor device forming a MISFET, comprising:
   forming a cavity inside a semiconductor substrate;
   forming a hole in the semiconductor substrate, the hole being connected to the cavity;
   forming a back gate insulating film on surfaces of the semiconductor substrate which are exposed from the cavity and hole;
   forming a back gate electrode in the cavity and hole having surfaces covered with the back gate insulating film;
   forming a front gate insulating film in a region on the semiconductor substrate in which a gate electrode of the MISFET is to be formed;
   forming a front gate electrode on the front gate insulating film, the front gate electrode having a different work function from that of the back gate electrode;
   selectively implanting impurities into portions of the semiconductor substrate which are not covered with the front gate electrode;
   partially etching the front gate electrode and front gate insulating film, to form a contact hole connected to the back gate electrode; and
   forming metal or metal silicide electrodes in the contact hole and on the front gate electrode.

9. The method of manufacturing a semiconductor device, according to claim 8, wherein a silicon layer into which impurities of a first conductivity type are mainly implanted is formed as the back gate electrode, and silicon into which impurities of a second conductivity type are implanted is formed as the front gate electrode.

10. The method of manufacturing a semiconductor device, according to claim 9, wherein a metal film is deposited on the semiconductor substrate, and the metal film and the front gate electrode are selectively reacted with each other, to form the electrodes in the hole and on the front gate electrode, and portions of the metal film which have not reacted are removed.

11. The method of manufacturing a semiconductor device, according to claim 8, wherein the cavity has a curved line that is opposed to a surface of the semiconductor substrate on which the front gate electrode is to be formed.

12. The method of manufacturing a semiconductor device, according to claim 8, wherein n-type impurities are implanted into the source and drain regions, and the work function of the front gate electrode is smaller than that of the back gate electrode.

13. The method of manufacturing a semiconductor device, according to claim 8, wherein p-type impurities are implanted into the source and drain regions, and the work function of the front gate electrode is larger than that of the back gate electrode.

14. The method of manufacturing a semiconductor device, according to claim 8, wherein a film thickness of the back gate insulating film is up to three times larger than a film thickness of the front gate insulating film.

15. The method of manufacturing a semiconductor device, according to claim 8, wherein the front gate electrode and back gate electrode are respectively made of different kinds of metal or metal compound.

* * * * *